(12) United States Patent
Chen et al.

(10) Patent No.: US 12,165,597 B2
(45) Date of Patent: Dec. 10, 2024

(54) DISPLAY SUBSTRATE, DISPLAY DEVICE, AND MANUFACTURING METHOD OF DISPLAY SUBSTRATE

(71) Applicants: Chengdu BOE Optoelectronics Technology Co., Ltd., Chengdu (CN); BOE TECHNOLOGY GROUP CO., LTD., Beijing (CN)

(72) Inventors: Yipeng Chen, Beijing (CN); Hui Lu, Beijing (CN); Ling Shi, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 18/020,971

(22) PCT Filed: Jan. 29, 2022

(86) PCT No.: PCT/CN2022/075000
§ 371 (c)(1),
(2) Date: Feb. 13, 2023

(87) PCT Pub. No.: WO2023/142043
PCT Pub. Date: Aug. 3, 2023

(65) Prior Publication Data
US 2024/0265873 A1    Aug. 8, 2024

(51) Int. Cl.
*G09G 3/3266* (2016.01)
*G11C 19/28* (2006.01)
*H01L 27/12* (2006.01)

(52) U.S. Cl.
CPC ......... *G09G 3/3266* (2013.01); *G11C 19/287* (2013.01); *H01L 27/1225* (2013.01);
(Continued)

(58) Field of Classification Search
CPC ......... G09G 3/3266; G09G 2300/0426; G09G 2300/0819; G09G 2300/0861;
(Continued)

(56) References Cited

U.S. PATENT DOCUMENTS 9,721,674 B2 * 8/2017 Gu .................. G11C 19/28
10,186,221 B2 * 1/2019 Shang ............... G11C 19/28
(Continued)

FOREIGN PATENT DOCUMENTS

| CN | 101211665 A | 7/2008 |
| CN | 105304013 A | 2/2016 |

(Continued)

OTHER PUBLICATIONS

International Search Report in PCT/CN2022/075000 dated Oct. 31, 2022 with English translation.
(Continued)

*Primary Examiner* — Ariel A Balaoing
(74) *Attorney, Agent, or Firm* — Collard & Roe, P.C.

(57) ABSTRACT

A display substrate and a manufacturing method thereof, and a display device are provided. The display substrate includes a gate driving circuit including shift register units and clock signal lines including a first clock signal line, a second clock signal line providing a second clock signal, and a third clock signal line providing a third clock signal. An input circuit of a n-th stage shift register unit in the shift register units is connected with the first clock signal line, a first control circuit of the n-th stage shift register unit is connected with the first clock signal line, the second clock signal line, and the third clock signal line, a second control circuit of the n-th stage shift register unit is connected with the second clock signal line, and a phase of the second clock signal is opposite to a phase of the third clock signal.

20 Claims, 9 Drawing Sheets

(52) U.S. Cl.
   CPC ........ H01L 27/1229 (2013.01); H01L 27/124 (2013.01); H01L 27/1259 (2013.01); *G09G 2300/0426* (2013.01); *G09G 2300/0819* (2013.01); *G09G 2300/0861* (2013.01); *G09G 2310/0286* (2013.01); *G09G 2310/08* (2013.01); *G09G 2320/045* (2013.01); *G09G 2330/02* (2013.01)

(58) Field of Classification Search
   CPC ....... G09G 2310/0286; G09G 2310/08; G09G 2320/045; G09G 2320/02; G11C 19/287; H01L 27/1225; H01L 27/1229; H01L 27/124; H01L 27/1259
   See application file for complete search history.

(56) References Cited

U.S. PATENT DOCUMENTS

| | | | |
|---|---|---|---|
| 10,217,427 B2* | 2/2019 | Zhang | G09G 3/3266 |
| 10,657,879 B1* | 5/2020 | Gu | G09G 3/3677 |
| 10,997,936 B2* | 5/2021 | Xu | G11C 19/28 |
| 11,335,293 B2* | 5/2022 | Xie | G09G 3/3677 |
| 11,417,262 B2* | 8/2022 | Kang | G11C 19/28 |
| 2010/0201666 A1 | 8/2010 | Tobita | |
| 2012/0105396 A1* | 5/2012 | Sakamoto | G09G 3/3677 |
| | | | 345/55 |
| 2013/0033468 A1* | 2/2013 | Takahashi | G11C 19/184 |
| | | | 345/204 |
| 2014/0133621 A1* | 5/2014 | Shang | G11C 19/184 |
| | | | 377/67 |
| 2016/0351156 A1* | 12/2016 | Wu | G11C 19/287 |
| 2019/0130857 A1 | 5/2019 | Ma | |
| 2019/0392916 A1 | 12/2019 | Gu et al. | |
| 2020/0243032 A1 | 7/2020 | Gu et al. | |
| 2021/0183326 A1* | 6/2021 | Fu | G09G 3/3677 |
| 2021/0366354 A1 | 11/2021 | Li et al. | |

FOREIGN PATENT DOCUMENTS

| | | |
|---|---|---|
| CN | 106782284 A | 5/2017 |
| CN | 109416902 A | 3/2019 |
| CN | 209265989 U | 8/2019 |
| CN | 113112960 A | 7/2021 |
| CN | 113284543 A | 8/2021 |
| CN | 113362772 A | 9/2021 |
| CN | 214541584 U | 10/2021 |
| EP | 3 709 287 A1 | 9/2020 |
| EP | 3 789 997 A1 | 3/2021 |
| EP | 4 020 448 A1 | 6/2022 |
| WO | 2021031167 A1 | 2/2021 |

OTHER PUBLICATIONS

Written Opinion in PCT/CN2022/075000 dated Oct. 31, 2022 in Chinese.
Written Opinion of the International Searching Authority in PCT/CN2022/075000 in Chinese dated Oct. 31, 2022 with English translation.

* cited by examiner

DISPLAY SUBSTRATE, DISPLAY DEVICE, AND MANUFACTURING METHOD OF DISPLAY SUBSTRATE

CROSS REFERENCE TO RELATED APPLICATIONS

This application is the National Stage of PCT/CN2022/075000 filed on Jan. 29, 2022, the disclosure of which is incorporated by reference.

TECHNICAL FIELD

At least one embodiment of the present disclosure relates to a display substrate, a display device, and a manufacturing method of the display substrate.

BACKGROUND

At present, in the field of display technology, classifying according to the manufacturing technology and material of a thin film transistor (TFT), TFT may include amorphous silicon (a-Si) TFT, Low Temperature Poly-Silicon (LTPS) TFT, oxide (for example, Indium Gallium Zinc Oxide (IGZO)) TFT, etc. The LTPS TFT is manufactured based on low-temperature polysilicon process, which can achieve lower driving current and lower driving voltage; the oxide TFT is manufactured based on oxide process, which can achieve lower refresh rate. Low temperature polycrystalline oxide (LTPO) is a low power consumption display technology. LTPO technology combines low-temperature polysilicon technology with oxide technology to prepare LTPS TFT and oxide TFT in the display panel, thus combining the advantages of LTPS TFT and the advantages of oxide TFT, making the best use of the advantage of ultra-high mobility of low-temperature polysilicon and the advantage of low leakage current of oxide to achieve better display performance.

SUMMARY

At least one embodiment of the present disclosure provides a display substrate, which comprises: a base substrate, and a gate driving circuit and a plurality of clock signal lines arranged on the base substrate. The gate driving circuit comprises a plurality of shift register units, each shift register unit comprises an input circuit, a first control circuit, a second control circuit, an output circuit, a trigger terminal, and an output terminal, the input circuit is electrically connected with the trigger terminal and a first node respectively and receives a first control signal, and is configured to input a trigger signal received by the trigger terminal to the first node under control of the first control signal; the first control circuit is electrically connected with the first node, a second node, and a first output node respectively and receives the first control signal, a second control signal, and a third control signal, and is configured to write a first output control signal into the first output node under control of the first control signal, a voltage of the first node, and the second control signal, the first output control signal comprises the third control signal; the second control circuit is electrically connected with the first node, the second node, and a second output node respectively and receives the second control signal, and is configured to write a second output control signal into the second output node under control of the second control signal and a voltage of the second node; the output circuit is electrically connected with a first voltage line, a second voltage line, the first output node, the second output node, and the output terminal respectively, and is configured to write a first voltage signal provided by the first voltage line or a second voltage signal provided by the second voltage line into the output terminal as an output signal under control of the first output control signal and the second output control signal; the plurality of clock signal lines comprise a first clock signal line, a second clock signal line, and a third clock signal line, the first clock signal line is configured to provide a first clock signal, the second clock signal line is configured to provide a second clock signal, and the third clock signal line is configured to provide a third clock signal, the plurality of shift register units comprise an n-th stage shift register unit, and n is a positive integer, an input circuit of the n-th stage shift register unit is connected with the first clock signal line to receive the first clock signal as the first control signal, a first control circuit of the n-th stage shift register unit is connected with the first clock signal line, the second clock signal line, and the third clock signal line to receive the first clock signal as the first control signal, to receive the second clock signal as the second control signal, and to receive the third clock signal as the third control signal, a second control circuit of the n-th stage shift register unit is connected with the second clock signal line to receive the second clock signal as the second control signal, and a phase of the second clock signal is opposite to a phase of the third clock signal.

For example, in the display substrate provided by at least one embodiment of the present disclosure, on the base substrate, the first clock signal line, the second clock signal line, and the third clock signal line extend in a first direction and are arranged in a second direction different from the first direction.

For example, in the display substrate provided by at least one embodiment of the present disclosure, in the second direction, the first clock signal line, the third clock signal line, and the second clock signal line are sequentially arranged.

For example, in the display substrate provided by at least one embodiment of the present disclosure, on the base substrate, the first voltage line and the second voltage line extend in the first direction and are arranged in the second direction.

For example, in the display substrate provided by at least one embodiment of the present disclosure, in the second direction, the first voltage line is between the third clock signal line and the second clock signal line, and the first clock signal line and the third clock signal line are between the first voltage line and the second voltage line.

For example, in the display substrate provided by at least one embodiment of the present disclosure, the first direction and the second direction are perpendicular to each other.

For example, in the display substrate provided by at least one embodiment of the present disclosure, each shift register unit comprises at least one first transistor, and at least one first transistor in the n-th stage shift register unit is electrically connected with the second clock signal line to be turned on or off under control of the second clock signal.

For example, in the display substrate provided by at least one embodiment of the present disclosure, the at least one first transistor is an oxide transistor.

For example, in the display substrate provided by at least one embodiment of the present disclosure, each shift register unit further comprises a plurality of second transistors, a type of at least one active layer of the at least one first transistor is different from types of active layers of the plurality of second transistors, the at least one active layer of the at least one first transistor is located in a same layer, and the active layers of the plurality of second transistors are located in a same layer, a layer where the at least one active layer of the at least one first transistor is located is different from a layer where the active layers of the plurality of second transistors are located.

For example, in the display substrate provided by at least one embodiment of the present disclosure, the plurality of second transistors are polysilicon transistors.

For example, in the display substrate provided by at least one embodiment of the present disclosure, an orthographic projection of the at least one active layer of the at least one first transistor on the base substrate does not overlap with an orthographic projection of the active layers of the plurality of second transistors on the base substrate.

For example, in the display substrate provided by at least one embodiment of the present disclosure, at least one gate electrode of the at least one first transistor is located in a same layer, and gate electrodes of the plurality of second transistors are located in a same layer, a layer where the at least one gate electrode of the at least one first transistor is located is different from a layer where the gate electrodes of the plurality of second transistors are located.

For example, the display substrate provided by at least one embodiment of the present disclosure further comprises at least one gate connection line corresponding to the at least one first transistor one by one and a plurality of holes, the plurality of holes comprise at least one first hole corresponding to each gate connection line, a gate electrode of each first transistor in the n-th stage shift register unit is electrically connected with a gate connection line corresponding to each first transistor, and the gate connection line corresponding to each first transistor extends to the second clock signal line approximately along the second direction and is electrically connected with the second clock signal line through at least one first hole corresponding to the gate connection line.

For example, in the display substrate provided by at least one embodiment of the present disclosure, the gate electrode of each first transistor is integrally provided with the gate connection line corresponding to each first transistor.

For example, in the display substrate provided by at least one embodiment of the present disclosure, an orthographic projection of each gate connection line on the base substrate does not overlap with an orthographic projection of holes other than the first hole in the plurality of holes on the base substrate.

For example, the display substrate provided by at least one embodiment of the present disclosure further comprises a semiconductor layer, a first insulating layer, a first metal layer, a second insulating layer, a second metal layer, a third insulating layer, an oxide layer, a fourth insulating layer, a third metal layer, a fifth insulating layer, and a fourth metal layer, which are successively stacked on the base substrate; the semiconductor layer is on the base substrate, the first insulating layer is on a side of the semiconductor layer away from the base substrate, the first metal layer is on a side of the first insulating layer away from the semiconductor layer, the second insulating layer is on a side of the first metal layer away from the first insulating layer, the second metal layer is on a side of the second insulating layer away from the first metal layer, the third insulating layer is on a side of the second metal layer away from the second insulating layer, the oxide layer is on a side of the third insulating layer away from the second metal layer, the fourth insulating layer is on a side of the oxide layer away from the third insulating layer, the third metal layer is on a side of the fourth insulating layer away from the oxide layer, the fifth insulating layer is on a side of the third metal layer away from the fourth insulating layer, and the fourth metal layer is on a side of the fifth insulating layer away from the third metal layer, and the at least one active layer of the at least one first transistor is in the oxide layer, and the active layers of the plurality of second transistors are in the semiconductor layer.

For example, in the display substrate provided by at least one embodiment of the present disclosure, at least one gate electrode of the at least one first transistor is in the third metal layer, and gate electrodes of the plurality of second transistors are in the first metal layer.

For example, in the display substrate provided by at least one embodiment of the present disclosure, the plurality of clock signal lines are in the fourth metal layer.

For example, in the display substrate provided by at least one embodiment of the present disclosure, n is an odd number or an even number, and the plurality of shift register units further comprise a (n+1)-th stage shift register unit, the plurality of clock signal lines further comprise a fourth clock signal line, and the fourth clock signal line is configured to provide a fourth clock signal, an input circuit of the (n+1)-th stage shift register unit is connected with the third clock signal line to receive the third clock signal as the first control signal, a first control circuit of the (n+1)-th stage shift register unit is connected with the first clock signal line, the third clock signal line, and the fourth clock signal line, to receive the third clock signal as the first control signal, the fourth clock signal as the second control signal, and the first clock signal as the third control signal, a second control circuit of the (n+1)-th stage shift register unit is connected with the fourth clock signal line to receive the fourth clock signal as the second control signal, and a phase of the first clock signal is opposite to a phase of the fourth clock signal.

For example, in the display substrate provided by at least one embodiment of the present disclosure, on the base substrate, the first clock signal line, the second clock signal line, the third clock signal line, and the fourth clock signal line extend in a first direction and are arranged in a second direction different from the first direction.

For example, in the display substrate provided by at least one embodiment of the present disclosure, in the second direction, the first clock signal line, the third clock signal line, the fourth clock signal line, and the second clock signal line are arranged in sequence.

For example, in the display substrate provided by at least one embodiment of the present disclosure, each shift register unit comprises at least one first transistor, and the at least one first transistor is an oxide transistor, at least one first transistor in the (n+1)-th stage shift register unit is electrically connected with the fourth clock signal line to be turned on or off under control of the fourth clock signal.

For example, the display substrate provided by at least one embodiment of the present disclosure further comprises at least one gate connection line corresponding to the at least one first transistor one by one and a plurality of holes, the plurality of holes comprise at least one second hole corresponding to each gate connection line, a gate electrode of each first transistor in the (n+1)-th stage shift register unit is electrically connected with a gate connection line corresponding to each first transistor, and the gate connection line corresponding to each first transistor extends to the fourth clock signal line approximately along the second direction and is electrically connected with the fourth clock signal line through at least one second hole corresponding to the gate connection line.

For example, the display substrate provided by at least one embodiment of the present disclosure further comprises a trigger signal line disposed on the base substrate, a trigger terminal of a first-stage shift register unit among the plurality of shift register units is electrically connected with the trigger signal line to receive a signal provided by the trigger signal line as a trigger signal of the first-stage shift register unit, in addition to the first-stage shift register unit, a trigger terminal of a current-stage shift register unit among the plurality of shift register units is connected to an output terminal of a previous-stage shift register unit adjacent to the current-stage shift register unit to receive an output signal output by the output terminal of the previous-stage shift register unit as a trigger signal of the current-stage shift register unit.

For example, in the display substrate provided by at least one embodiment of the present disclosure, the first control circuit is further electrically connected with the first voltage line, the second voltage line, and the input circuit, the first control circuit comprises a first control input sub-circuit, a second control input sub-circuit, a bootstrap sub-circuit, a first control output sub-circuit, and a second control output sub-circuit, the first control input sub-circuit is electrically connected to the second voltage line and the second node, respectively, and is configured to write the second voltage signal into the second node under control of the first control signal; the second control input sub-circuit is electrically connected with the input circuit and the second node, respectively, and is configured to write the first control signal into the second node under control of the trigger signal; the bootstrap sub-circuit is electrically connected with the second node and a third node, respectively, and is configured to write the third control signal into the third node under control of the voltage of the second node; the first control output sub-circuit is electrically connected with the third node and the first output node, respectively, and is configured to write the third control signal into the first output node under the control of the second control signal; the second control output sub-circuit is electrically connected with the first node, the first voltage line, and the first output node, respectively, and is configured to write the first voltage signal into the first output node under control of the voltage of the first node, and the first output control signal further comprises the first voltage signal.

For example, in the display substrate provided by at least one embodiment of the present disclosure, the first control input sub-circuit comprises a first control input transistor, a first electrode of the first control input transistor is electrically connected to the second voltage line, a second electrode of the first control input transistor is electrically connected to the second node, and a gate electrode of the first control input transistor is configured to receive the first control signal; the second control input sub-circuit comprises a second control input transistor, a first electrode of the second control input transistor is configured to receive the first control signal, a second electrode of the second control input transistor is electrically connected with the second node, and a gate electrode of the second control input transistor is electrically connected with the first node; the bootstrap sub-circuit comprises a first capacitor and a bootstrap transistor, a gate electrode of the bootstrap transistor is electrically connected to the second node, a second electrode of the bootstrap transistor is electrically connected to the third node, and a first electrode of the bootstrap transistor is configured to receive the third control signal; a first end of the first capacitor is connected to the second node, and a second end of the first capacitor is electrically connected to the third node; the first control output sub-circuit comprises a first control output transistor, a gate electrode of the first control output transistor is configured to receive the second control signal, a first electrode of the first control output transistor is electrically connected with the third node, and a second electrode of the first control output transistor is electrically connected with the first output node; and the second control output sub-circuit comprises a second control output transistor, a gate electrode of the second control output transistor is electrically connected to the first node, a first electrode of the second control output transistor is electrically connected to the first voltage line, and a second electrode of the second control output transistor is electrically connected to the first output node.

For example, in the display substrate provided by at least one embodiment of the present disclosure, the at least one first transistor comprises the first control output transistor.

For example, in the display substrate provided by at least one embodiment of the present disclosure, on the base substrate, an orthographic projection of the gate electrode of the second control output transistor in the first direction at least partially overlaps with an orthographic projection of the gate electrode of the first control output transistor in the first direction.

For example, in the display substrate provided by at least one embodiment of the present disclosure, the first control circuit further comprises a first isolation sub-circuit, the first isolation sub-circuit is electrically connected with the second node, the bootstrap sub-circuit, and the second voltage line, respectively, and is configured to isolate the second node from the bootstrap sub-circuit.

For example, in the display substrate provided by at least one embodiment of the present disclosure, the first isolation sub-circuit comprises a first isolation transistor, a first electrode of the first isolation transistor is electrically connected with the second node, a second electrode of the first isolation transistor is electrically connected with the bootstrap sub-circuit, and a gate electrode of the first isolation transistor is electrically connected with the second voltage line.

For example, in the display substrate provided by at least one embodiment of the present disclosure, the second control circuit is also electrically connected to the first voltage line, the second control circuit comprises a third control input sub-circuit, the third control input sub-circuit is electrically connected with the first node, the second node, and the first voltage line, respectively, and is configured to write the first voltage signal into the first node under control of the voltage of the second node and the second control signal.

For example, in the display substrate provided by at least one embodiment of the present disclosure, the third control input sub-circuit comprises a third control input transistor and a fourth control input transistor, a first electrode of the third control input transistor is electrically connected to the first voltage line, a second electrode of the third control input transistor is electrically connected to a first electrode of the fourth control input transistor, and a gate electrode of the third control input transistor is electrically connected to the second node, a second electrode of the fourth control input transistor is electrically connected with the first node, and a gate electrode of the fourth control input transistor is configured to receive the second control signal.

For example, in the display substrate provided by at least one embodiment of the present disclosure, the at least one first transistor comprises the fourth control input transistor.

For example, in the display substrate provided by at least one embodiment of the present disclosure, the second control circuit is also electrically connected to the second voltage line, the second control circuit further comprises a second isolation sub-circuit, the second isolation sub-circuit is electrically connected with the first node, the second output node, and the second voltage line, respectively, and is configured to isolate the first node and the second output node.

For example, in the display substrate provided by at least one embodiment of the present disclosure, the second isolation sub-circuit comprises a second isolation transistor, a first electrode of the second isolation transistor is electrically connected to the first node, a second electrode of the second isolation transistor is electrically connected to the second output node, and a gate electrode of the second isolation transistor is electrically connected to the second voltage line.

For example, in the display substrate provided by at least one embodiment of the present disclosure, the output circuit comprises a first output sub-circuit and a second output sub-circuit, the first output sub-circuit is electrically connected with the first output node, the first voltage line, and the output terminal, respectively, and is configured to store the first output control signal and write the first voltage signal into the output terminal in a first phase under control of the first output control signal; the second output sub-circuit is electrically connected with the second output node, the second voltage line, and the output terminal, respectively, and is configured to store the second output control signal and write the second voltage signal into the output terminal in a second phase under control of the second output control signal; the output signal comprises the first voltage signal in the first phase and the second voltage signal in the second phase.

For example, in the display substrate provided by at least one embodiment of the present disclosure, the output circuit is further configured to receive the third control signal, the first output sub-circuit comprises a first output transistor and a second capacitor, a gate electrode of the first output transistor is electrically connected with the first output node, a first electrode of the first output transistor is electrically connected with the first voltage line, a second electrode of the first output transistor is electrically connected with the output terminal, a first end of the second capacitor is electrically connected with the first output node, and a second end of the second capacitor is electrically connected with the first voltage line, and the second output sub-circuit comprises a second output transistor and a third capacitor, a gate electrode of the second output transistor is electrically connected with the second output node, a first electrode of the second output transistor is electrically connected with the second voltage line, a second electrode of the second output transistor is electrically connected with the output terminal, a first end of the third capacitor is electrically connected with the first output node, and a second end of the third capacitor is configured to receive the third control signal.

For example, in the display substrate provided by at least one embodiment of the present disclosure, the input circuit comprises an input transistor, a first electrode of the input transistor is electrically connected with the trigger terminal, a second electrode of the input transistor is electrically connected with the first node, and a gate electrode of the input transistor is configured to receive the first control signal.

For example, the display substrate provided by at least one embodiment of the present disclosure further comprises a plurality of pixel circuits disposed on the base substrate, the gate driving circuit is configured to output a plurality of output signals to the plurality of pixel circuits to control the plurality of pixel circuits, each pixel circuit comprises at least one third transistor, a type of at least one active layer of the at least one first transistor is same as a type of at least one active layer of the at least one third transistor, the at least one active layer of the at least one first transistor and the at least one active layer of the at least one third transistor are in a same layer, and at least one gate electrode of the at least one first transistor and at least one gate electrode of the at least one third transistor are in a same layer.

For example, in the display substrate provided by at least one embodiment of the present disclosure, the at least one third transistor is an oxide transistor.

For example, in the display substrate provided by at least one embodiment of the present disclosure, each pixel circuit comprises a driving sub-circuit, a data writing sub-circuit, a storage sub-circuit, a compensation sub-circuit, a light emitting control sub-circuit, a first reset sub-circuit, a second reset sub-circuit, and a refresh control sub-circuit, the driving sub-circuit comprises a control terminal, a first terminal, and a second terminal; the data writing sub-circuit is configured to write a data signal provided by the data signal line to the first terminal of the driving sub-circuit in response to a scanning signal; the storage sub-circuit is connected to the control terminal of the driving sub-circuit and configured to store a compensation signal obtained based on the data signal; the compensation sub-circuit is connected to the second terminal of the driving sub-circuit and configured to perform threshold compensation on the driving sub-circuit in response to a compensation control signal; the light emitting control sub-circuit is connected to the first terminal and the second terminal of the driving sub-circuit and configured to control a driving current generated by the driving sub-circuit to be transmitted to a light emitting element in response to a light emitting control signal; the first reset sub-circuit is connected to the refresh control sub-circuit and configured to reset the control terminal of the driving sub-circuit through the refresh control sub-circuit in response to a first reset signal; the second reset sub-circuit is configured to reset the light emitting element in response to a second reset signal; and the refresh control sub-circuit is connected to the control terminal of the driving sub-circuit and the compensation sub-circuit, and is configured to achieve a connection or disconnection between the control terminal of the driving sub-circuit and the compensation sub-circuit in response to a refresh control signal.

For example, in the display substrate provided by at least one embodiment of the present disclosure, the refresh control sub-circuit comprises a refresh control transistor, and the at least one third transistor comprises the refresh control transistor.

For example, in the display substrate provided by at least one embodiment of the present disclosure, the plurality of output signals output by the gate driving circuit comprise the refresh control signal.

At least one embodiment of the present disclosure provides a display device comprising the display substrate according to any embodiment of the present disclosure.

At least one embodiment of the present disclosure provides a manufacturing method of the display substrate according to any embodiment of the present disclosure, comprising: providing the base substrate; sequentially forming a semiconductor layer, a first insulating layer, a first metal layer, a second insulating layer, a second metal layer, a third insulating layer, an oxide layer, a fourth insulating layer, a third metal layer, a fifth insulating layer, and a fourth metal layer in a direction perpendicular to the base substrate; the plurality of clock signal lines are in the fourth metal layer; the gate driving circuit is formed in the semiconductor layer, the oxide layer, the first metal layer, the second metal layer, the third metal layer, and the fourth metal layer; the gate driving circuit is respectively connected with the plurality of clock signal lines through a plurality of holes located in the first insulating layer, the second insulating layer, the third insulating layer, the fourth insulating layer, and the fifth insulating layer.

BRIEF DESCRIPTION OF THE DRAWINGS

In order to more clearly illustrate the technical solutions of the embodiments of the present disclosure, the drawings of the embodiments will be briefly described in the following: it is obvious that the described drawings below are only related to some embodiments of the present disclosure and thus are not a limitation to the present disclosure.

DETAILED DESCRIPTION

Figure 1:
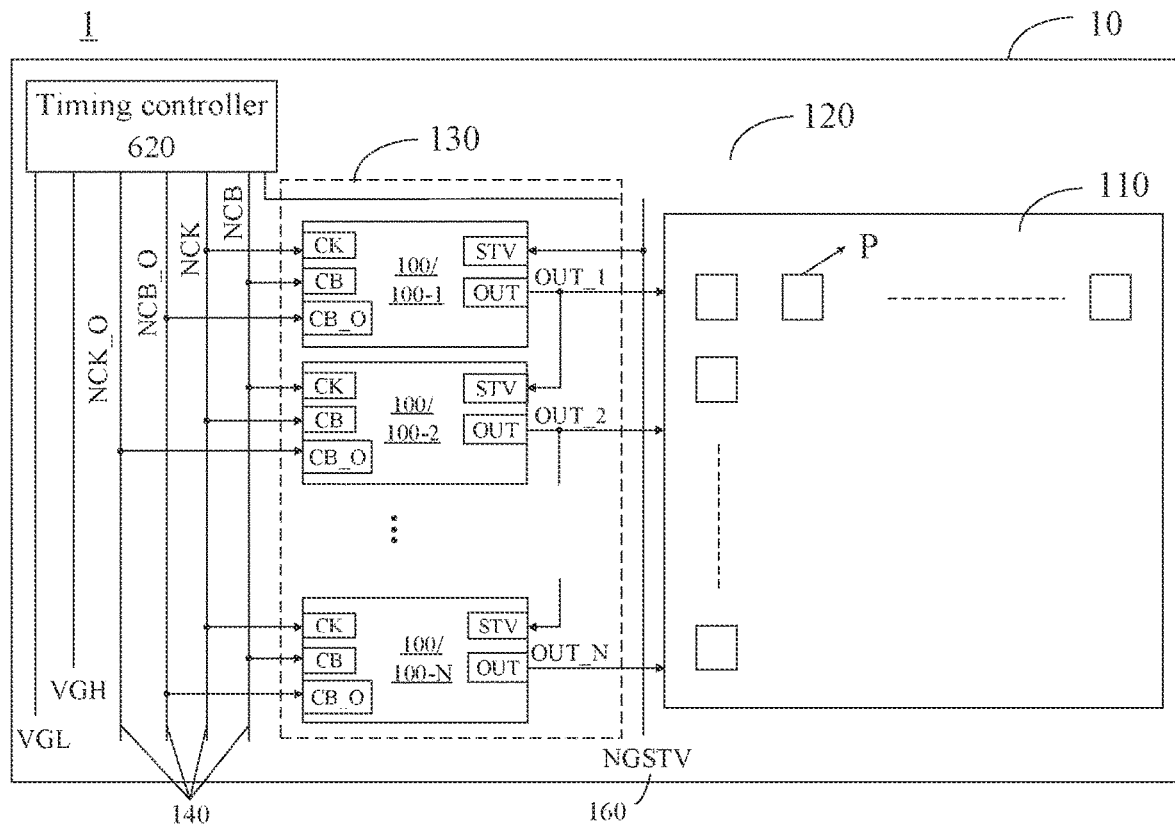
FIG. 1 is a schematic diagram of a display substrate provided by at least one embodiment of the present disclosure.

In order to make objects, technical solutions, and advantages of the embodiments of the present disclosure more apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount, or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits the detailed description of some known functions and known components.

LTPO technology may be applied to the organic light-emitting diode display panel, thus reducing the power consumption of the display panel. The power consumption of the display panel includes driving power and luminous power. The display panel based on LTPO technology has lower driving power than the display panel based on LTPS technology. The display panel based on LTPS technology needs 60 Hz to display a still image, but the display panel based on LTPO technology may display a still image using 1 Hz, thus greatly reducing the driving power.

Based on LTPO technology, some transistors in the display panel are oxide transistors (e.g., N-type oxide transistors), and the leakage current of the oxide transistor is less, which can keep the voltage (charge) of the capacitor for one second to achieve a refresh frequency of 1 Hz. The leakage current of the LTPS transistor is larger, and 60 Hz is required even for driving still pixels; otherwise, the brightness will be greatly reduced.

At first, LTPO technology is applied to smart watches. The efficiency of LTPO has been greatly proved in the smart watches. Because the black region on the screen of the smart watch is wide, the luminous power is low. Based on LTPO technology, the ratio of driving power to luminous power of the smart watch is about 6:4. LTPO technology can reduce the existing driving power to one third, thus reducing the overall power consumption by 40%.

At least one embodiment of the present disclosure provides a display substrate, and the display substrate comprises: a base substrate, and a gate driving circuit and a plurality of clock signal lines arranged on the base substrate. The gate driving circuit comprises a plurality of shift register units, each shift register unit comprises an input circuit, a first control circuit, a second control circuit, an output circuit, a trigger terminal, and an output terminal, the input circuit is electrically connected with the trigger terminal and a first node respectively and receives a first control signal, and is configured to input a trigger signal received by the trigger terminal to the first node under control of the first control signal; the first control circuit is electrically connected with the first node, a second node, and a first output node respectively and receives the first control signal, a second control signal, and a third control signal, and is configured to write a first output control signal into the first output node under control of the first control signal, a voltage of the first node, and the second control signal, the first output control signal comprises the third control signal; the second control circuit is electrically connected with the first node, the second node, and a second output node respectively and receives the second control signal, and is configured to write a second output control signal into the second output node under control of the second control signal and a voltage of the second node; the output circuit is electrically connected with a first voltage line, a second voltage line, the first output node, the second output node, and the output terminal respectively, and is configured to write a first voltage signal provided by the first voltage line or a second voltage signal provided by the second voltage line into the output terminal as an output signal under control of the first output control signal and the second output control signal; the plurality of clock signal lines comprise a first clock signal line, a second clock signal line, and a third clock signal line, the first clock signal line is configured to provide a first clock signal, the second clock signal line is configured to provide a second clock signal, and the third clock signal line is configured to provide a third clock signal, the plurality of shift register units comprise an n-th stage shift register unit, and n is a positive integer, an input circuit of the n-th stage shift register unit is connected with the first clock signal line to receive the first clock signal as the first control signal, a first control circuit of the n-th stage shift register unit is connected with the first clock signal line, the second clock signal line, and the third clock signal line to receive the first clock signal as the first control signal, to receive the second clock signal as the second control signal, and to receive the third clock signal as the third control signal, a second control circuit of the n-th stage shift register unit is connected with the second clock signal line to receive the second clock signal as the second control signal, and a phase of the second clock signal is opposite to a phase of the third clock signal.

In the display substrate provided by the embodiment of the present disclosure, the gate driving circuit is implemented based on LTPO technology, which can ensure the output stability of the gate driving circuit and reduce the overall power consumption of the gate driving circuit; in the gate driving circuit, by separately setting a second clock signal line and making the phase of the second clock signal opposite to that of the third clock signal, the normal working process of the gate driving circuit may be controlled based on the first clock signal, the second clock signal, and the third clock signal, and the function that the output of the gate driving circuit is accurate and stable can be achieved without adding more processes. Moreover, the layout of the gate driving circuit is simple and easy to implement.

At least one embodiment of the present disclosure also provides a display device corresponding to the above display substrate and a manufacturing method for manufacturing the above display substrate.

The embodiments of the present disclosure will be described in detail below with reference to the accompanying drawings, but the present disclosure is not limited to these specific embodiments.

At least one embodiment of the present disclosure provides a display substrate. FIG. 1 is a schematic diagram of a display substrate provided by at least one embodiment of the present disclosure.

For example, as shown in FIG. 1, the display substrate 1 may include a base substrate 10, a gate driving circuit 130, and a plurality of clock signal lines 140. For example, in some embodiments of the present disclosure, the display substrate 1 may be an organic light emitting diode (OLED) display substrate, and may also be a quantum dot light emitting diode (QLED) display substrate, an electronic paper display substrate, etc., and the embodiments of the present disclosure are not limited to this.

For example, the base substrate 10 may be a flexible substrate or a rigid substrate. The base substrate 10 may be made of, for example, glass, plastic, quartz, or other suitable materials, and the embodiments of the present disclosure do not limit this.

For example, the base substrate 10 may include a display region 110 and a peripheral region 120. The display region 110 is used for display, while the peripheral region 120 is not used for display, but for setting various components such as wires and circuits. For example, the gate driving circuit 130, the plurality of clock signal lines 140, and the like may be disposed in the peripheral region 120 and located on one side of the base substrate 10, for example, on the left side of the base substrate 10 as shown in FIG. 1.

For example, as shown in FIG. 1, the display region 110 includes a plurality of pixel units P arranged in an array. For example, each pixel unit P includes a pixel circuit, for example, each pixel unit P may further include a light emitting element (not shown in FIG. 1), and the pixel circuit is configured to drive the corresponding light emitting element to emit light to achieve the display function.

Figure 2A:
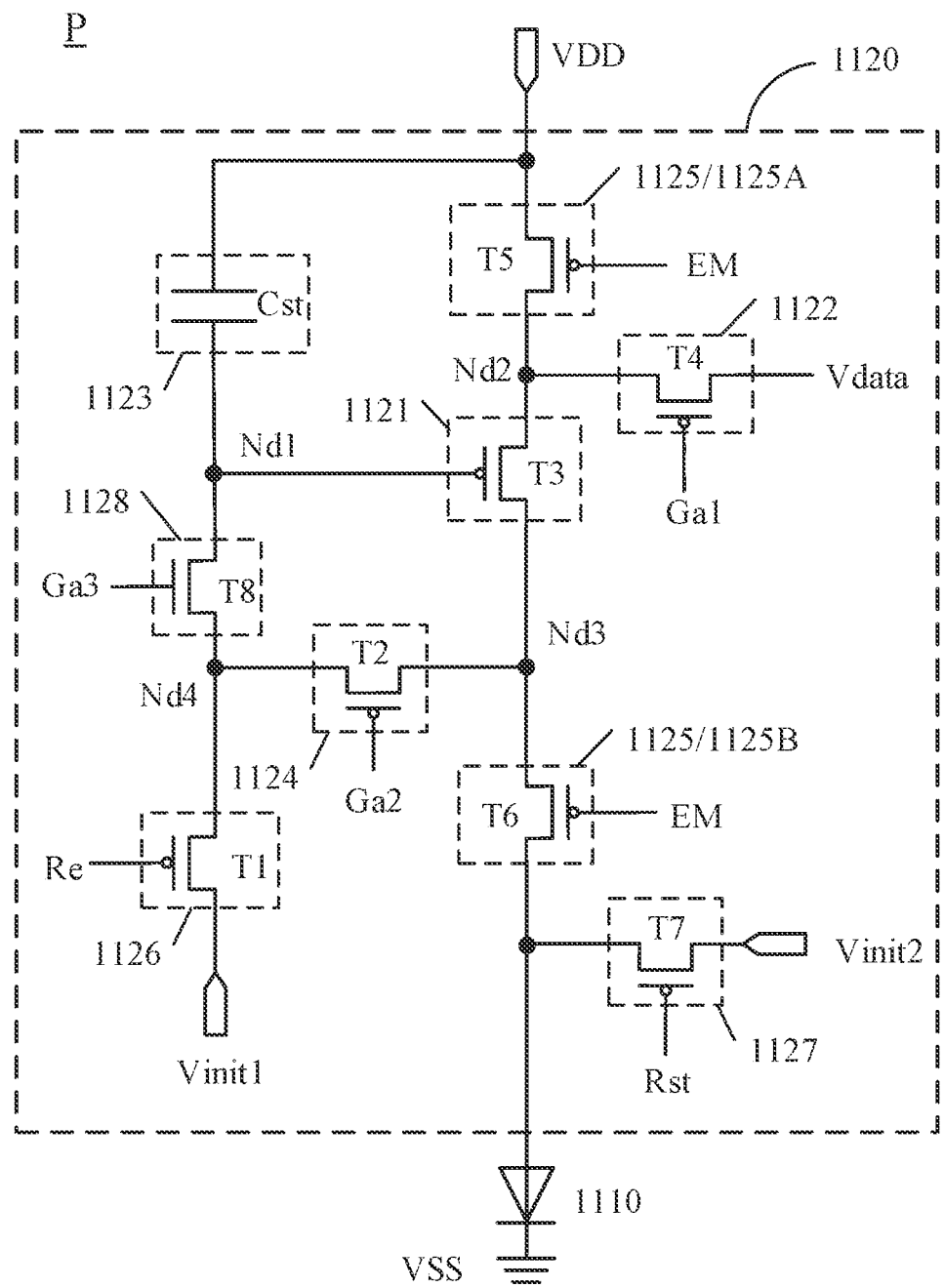
FIG. 2A is a schematic diagram of a pixel circuit provided by some embodiments of the present disclosure.

FIG. 2A is a schematic diagram of a pixel circuit provided by some embodiments of the present disclosure. The specific structure of the pixel circuit provided by some embodiments of the present disclosure is briefly described below with reference to FIG. 2A.

For example, a plurality of pixel circuits respectively included in the plurality of pixel units P are disposed on the base substrate 10, as shown in FIG. 1, in the display region 110 of the base substrate 10. The gate driving circuit 130 is configured to output a plurality of output signals to the plurality of pixel circuits to control the plurality of pixel circuits to generate a plurality of driving currents to respectively drive the light emitting elements in the plurality of pixel units P to emit corresponding light, thereby achieving image display.

For example, as shown in FIG. 2A, each pixel unit P includes a pixel circuit 1120 and a light emitting element 1110.

For example, the pixel circuit 1120 is configured to generate a driving current to control the light emitting element 1110 to emit light.

For example, the light emitting element 1110 includes a first electrode, a second electrode, and a light emitting layer disposed between the first electrode and the second electrode. As shown in FIG. 2A, the first electrode of the light emitting element 1110 is electrically connected to the pixel circuit 1120, and the second electrode of the light emitting element 1110 is electrically connected to the voltage terminal VSS. When the driving current generated by the pixel circuit 1120 flows through the light emitting element 1110, the light emitting layer of the light emitting element 1110 emits light with brightness corresponding to the driving current.

For example, the light emitting element 1110 may be a light emitting diode or the like. The light emitting diode may be a micro light emitting diode (Micro LED), an organic light emitting diode (OLEDs), or, a quantum dot light emitting diode (QLED), etc. The light emitting element 1110 is configured to receive a light emitting signal (for example, a driving current) and emit light with an intensity corresponding to the light emitting signal when working. The first electrode of the light emitting element 1110 may be an anode, and the second electrode of the light emitting diode may be a cathode. It should be noted that, in the embodiment of the present disclosure, the light emitting layer of the light emitting element 1110 may include the electroluminescent layer itself and common layers located on both sides of the electroluminescent layer. For example, the common layers may include a hole injection layer, a hole transport layer, an electron injection layer, an electron transport layer, and the like. In actual application, the specific structure of the light emitting element 1110 may be designed and determined according to the actual application environment, which is not limited here. For example, the light emitting element 1110 has a light emitting threshold voltage, and the light emitting element 1110 emits light when the voltage between the first electrode and the second electrode of the light emitting element 1110 is greater than or equal to the light emitting threshold voltage.

For example, as shown in FIG. 2A, the pixel circuit 1120 includes a driving sub-circuit 1121, a data writing sub-circuit 1122, a storage sub-circuit 1123, a compensation sub-circuit 1124, a light emitting control sub-circuit 1125, a first reset sub-circuit 1126, a second reset sub-circuit 1127, and a refresh control sub-circuit 1128.

For example, the driving sub-circuit 1121 includes a first terminal, a second terminal, and a control terminal, and is configured to generate a driving current that drives the light emitting element 1110 to emit light. For example, as shown in FIG. 2A, the control terminal of the driving sub-circuit 1121 is electrically connected to a node Nd1, the first terminal of the driving sub-circuit 1121 is electrically connected to a node Nd2, and the second terminal of the driving sub-circuit 1121 is electrically connected to a node Nd3.

For example, as shown in FIG. 2A, the data writing sub-circuit 1122 is electrically connected to the first terminal of the driving sub-circuit 1121 (i.e., the node Nd2) and a data signal line, and is configured to write a data signal Vdata provided by the data signal line to the first terminal of the driving sub-circuit 1121 in response to a scanning signal Ga1.

For example, as shown in FIG. 2A, the storage sub-circuit 1123 is electrically connected to a voltage terminal VDD and the control terminal (i.e., node Nd1) of the driving sub-circuit 1121, and is configured to store a compensation signal obtained based on the data signal Vdata.

For example, as shown in FIG. 2A, the compensation sub-circuit 1124 is electrically connected to the second terminal (i.e., node Nd3) of the driving sub-circuit 1121 and a node Nd4, and is configured to perform threshold compensation on the driving sub-circuit 1121 in response to a compensation control signal Ga2. The compensation signal stored in the storage sub-circuit 1123 indicates a signal that has been subjected to threshold compensation.

For example, as shown in FIG. 2A, the light emitting control sub-circuit 1125 is connected to the first terminal and the second terminal of the driving sub-circuit 1121, and is configured to control the driving current generated by the driving sub-circuit 1121 to be transmitted to the light emitting element 1110 in response to a light emitting control signal EM. For example, the light emitting control sub-circuit 1125 includes a first light emitting control sub-circuit 1125A and a second light emitting control sub-circuit 1125B. The first light emitting control sub-circuit 1125A is electrically connected to the first terminal (i.e., node Nd2) of the driving sub-circuit 1121 and the voltage terminal VDD, and is configured to implement the connection or disconnection between the driving sub-circuit 1121 and the voltage terminal VDD in response to the light emitting control signal EM. The second light emitting control sub-circuit 1125B is electrically connected to the second terminal (i.e., the node Nd3) of the driving sub-circuit 1121 and the first electrode of the light emitting element 1110, and is configured to implement the connection or disconnection between the driving sub-circuit 1121 and the light emitting element 1110 (for example, the first electrode of the light emitting element 1110) in response to the light emitting control signal EM.

For example, as shown in FIG. 2A, the first reset sub-circuit 1126 is electrically connected to the refresh control sub-circuit 1128 and a first reset voltage terminal Vinit1, and is configured to reset the control terminal (i.e., node Nd1) of the driving sub-circuit 1121 via the refresh control sub-circuit 1128 in response to the first reset control signal Re. For example, the first reset sub-circuit 1126 may write a first reset voltage provided by the first reset voltage terminal Vinit1 into the control terminal (i.e., the node Nd1) of the driving sub-circuit 1121 via the refresh control sub-circuit 1128, so as to reset the control terminal of the driving sub-circuit 1121.

For example, as shown in FIG. 2A, the second reset sub-circuit 1127 is electrically connected to the first electrode of the light emitting element 1110 and a second reset voltage terminal Vinit2, and is configured to reset the first electrode of the light emitting element 1110 in response to a second reset control signal Rst. For example, the second reset sub-circuit 1127 may write a second reset voltage provided by the second reset voltage terminal Vinit2 to the first electrode of the light emitting element 1110 to reset the first electrode of the light emitting element 1110.

For example, as shown in FIG. 2A, the refresh control sub-circuit 1128 is electrically connected to the control terminal (i.e., the node Nd1) of the driving sub-circuit 1121 and the node Nd4, that is, the refresh control sub-circuit 1128 and the compensation sub-circuit 1124 are electrically connected, and the refresh control sub-circuit 1128 is configured to achieve the connection or disconnection between the control terminal (i.e., the node Nd1) of the driver sub-circuit 1121 and the compensation sub-circuit 1124 in response to a refresh control signal Ga3. In the example shown in FIG. 2A, the refresh control sub-circuit 1128 is used to achieve the connection or disconnection between the node Nd1 and the node Nd4 in response to the refresh control signal Ga3.

For example, the display panel is often in a case of switching the images at a low frequency, such as switching pictures for display and web browsing, for example, in this case, the switching frequency of the content displayed by the display panel (i.e., the screen refresh frequency of the display panel) may be 1 Hz, 5 Gz, etc. In this case, the pixel circuit in the display panel is in a first display mode, for example, a low-frequency display mode. When the display panel displays dynamic videos and the like, the switching frequency of the content displayed by the display panel is high. For example, at this time, the switching frequency of the content displayed by the display panel may be 50 Hz, 60 Hz, etc., in this case, the pixel circuit in the display panel is in a second display mode, for example, a high-frequency display mode.

For example, the refresh control sub-circuit 1128 is used to control whether the compensation signal obtained based on the data signal can be transmitted to the node Nd1, thereby controlling the display mode of the pixel circuit 1120. For example, the refresh control sub-circuit 1128 may ensure that the node Nd1 in the pixel circuit 1120 is not refreshed for a relatively long time (e.g., 1 second), so as to control the pixel circuit 1120 to drive at a low frequency and achieve a low-frequency display mode.

For example, as shown in FIG. 1, the output terminals of a plurality of shift register units 100 in the gate driving circuit 130 are respectively connected with the refresh control sub-circuits 1128 of pixel circuits in respective rows located in the display region 110 to provide output signals (e.g., the refresh control signal Ga3) to the refresh control sub-circuits 1128 of the pixel circuits in the respective rows.

For example, in some embodiments, the scanning signal Ga1, the compensation control signal Ga2, and the second reset control signal Rst may be the same signal, so that the data writing sub-circuit 1122, the compensation sub-circuit 1124, and the second reset sub-circuit 1127 may be connected to the same signal line, thereby reducing the number of signal lines, which facilitates the narrow bezel design of the display panel, reduces the wiring space of the pixel circuits, and improves the resolution of the display panel. In addition, the scanning signal Ga1, the compensation control signal Ga2, and the second reset control signal Rst may be generated by the same gate driving circuit, so that the number of gate driving circuits can be reduced, the space can be saved, and the cost can be reduced.

For example, the first reset control signal Re and the scanning signal Ga1 may be generated by the same gate driving circuit, and are the signals output by two adjacent rows of shift register units in the gate driving circuit, respectively.

For example, the display substrate 1 may further include a gate driving circuit (hereinafter simply referred to as a light emitting control gate driving circuit) for generating the light emitting control signal EM and a gate driving circuit (hereinafter simply referred to as a scanning control gate driving circuit) for generating the scanning signal Ga1 and the first reset control signal Re. As such, the pixel circuit 1120 may be controlled by control signals generated by three gate driving circuits (namely, the light emitting control gate driving circuit, the scanning control gate driving circuit, and the gate driving circuit 130). For example, in some embodiments, the structure of the light emitting control gate driving circuit, the structure of the scanning control gate driving circuit, and the like may be the same as the structure of the gate driving circuit 130 provided in the present disclosure, and the three gate driving circuits jointly drive the pixel units in the display region 110 of the display substrate 1.

Figure 2B:
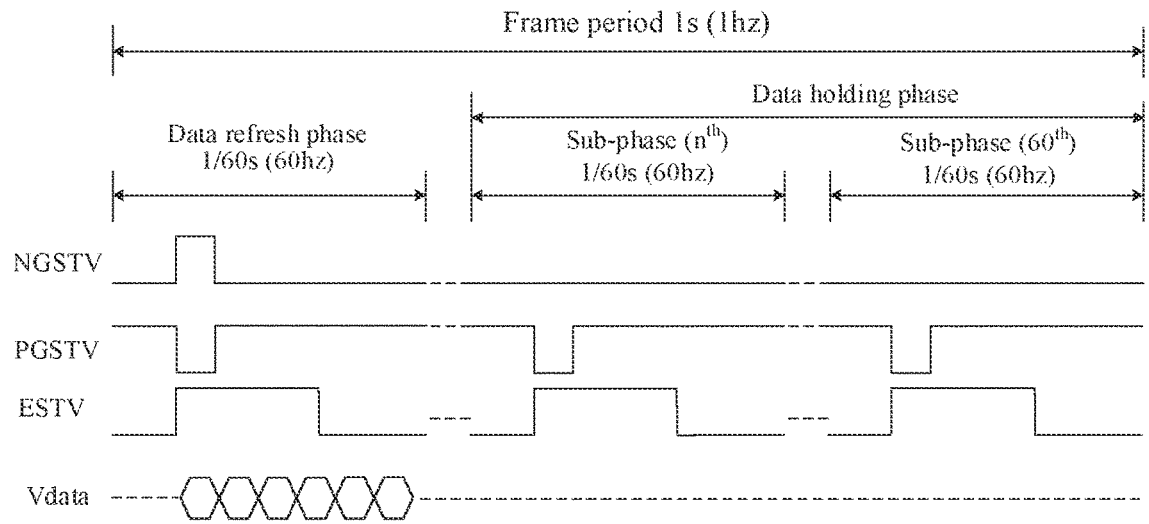
FIG. 2B is a signal timing diagram corresponding to a gate driving circuit provided by some embodiments of the present disclosure.

FIG. 2B is a signal timing diagram corresponding to the gate driving circuit provided by some embodiments of the present disclosure. The signal timing diagram shown in FIG. 2B shows a timing diagram when the pixel circuit is driven at a low frequency.

As shown in FIG. 2B, the NGSTV signal represents the trigger signal (described later) received by the first-stage shift register unit of the gate driving circuit 130 shown in FIG. 1, the PGSTV signal represents the trigger signal received by the first-stage shift register unit of the scanning control gate driving circuit, and the ESTV signal represents the trigger signal received by the first-stage shift register unit of the light emitting control gate driving circuit. Vdata represents the data signal provided by the data signal line.

For example, as shown in FIG. 2B, in the low-frequency display mode, the frame period corresponding to the pixel circuit 1120 may be 1 second (s), that is, the screen refresh frequency of the display panel including the pixel circuit 1120 is 1 Hz. In a data refresh phase, the NGSTV signal is at a high level for a certain period of time, the POSTV signal is at a low level for a certain period of time, and the ESTV signal is at a low level for a certain period of time, so that the data signal Vdata may be written into the control terminal of the driving sub-circuit 1221, and then the light emitting element 1110 is controlled to emit light. A data holding phase includes a plurality of sub-phases (e.g., sub-phase $n^{th}$, sub-phase $60^{th}$, etc.), each sub-phase is 1/60 second. In each sub-phase, the PGSTV signal is at a low level for a certain period of time, and the ESTV signal is at a low level for a certain period of time, that is, in the data holding phase, the PGSTV signal and the ESTV signal are periodically in a low-level state, that is, the structure and driving timing of the scanning control gate driving circuit and the light emitting control gate driving circuit remain unchanged. In the whole data holding phase, the NGSTV signal is kept at a low level, so that the refresh control sub-circuits 1128 in the pixel circuits 1120 are all in a closed state, thereby ensuring that the nodes Nd1 in the pixel circuits 1120 are not refreshed. In addition, in the whole data holding phase, the data signal Vdata may be in a High-Z (low power consumption) state, which can greatly reduce the driving power consumption of the source driver for outputting the data signal Vdata. In the data holding phase, the source driver can output a signal with the lowest power consumption for the source driver.

For example, as shown in FIG. 2B, the data refresh phase may be 1/60 second, and the data holding phase may be 59/60 second.

For example, when it is necessary to achieve the high-frequency display mode, the timing of the NGSTV signal may be adjusted to make the generation period of the high-level pulse with a fixed duty ratio in the NGSTV signal be 1/60 second, so that the frame period becomes 1/60 second, and the screen refresh frequency of the display panel including the pixel circuit 1120 is 60 Hz, thus implementing high-frequency driving.

For example, as shown in FIG. 2A, the refresh control sub-circuit 1128 includes a refresh control transistor T8, and the display mode (e.g., the low-frequency display mode or the high-frequency display mode) of the display panel may be controlled by controlling the turn-on frequency of the refresh control transistor T8. For example, the frequency of the refresh control signal Ga3 for controlling the refresh control transistor T8 is reduced according to the display requirements of the display mode, thereby implementing low-frequency writing of the data signal and implementing low-frequency display. It should be noted that the turn-on frequency here refers to the number of times a transistor is turned on in a unit time. For example, the higher the frequency at which the control signal of the gate electrode of a transistor is in an effective state, the higher the turn-on frequency of the transistor.

For example, a type of an active layer of the refresh control transistor T8 is different from that of a transistor included in at least one selected from a group consisting of the driving sub-circuit 1121, the data writing sub-circuit 1122, the storage sub-circuit 1123, the compensation sub-circuit 1124, the light emitting control sub-circuit 1125, the first reset sub-circuit 1126, and the second reset sub-circuit 1127, that is, the pixel circuit is a pixel circuit with multiple types of transistors. For example, the refresh control transistor T8 is an oxide transistor. For example, in some embodiments, the refresh control transistor T8 may be an indium gallium zinc oxide thin film transistor. For example, the refresh control transistor T8 may be an N-type transistor.

It should be noted that, in the present disclosure, "the type of the active layer" indicates the type of a material used to manufacture the active layer. The material of the active layer may include indium gallium zinc oxide, low-temperature polysilicon, amorphous silicon (e.g., hydrogenated amorphous silicon), low-temperature polysilicon oxide, etc. For example, the type of the active layer of a thin film transistor using indium gallium zinc oxide as the active layer is different from the type of the active layer of a thin film transistor using low-temperature polysilicon as the active layer. In the present disclosure, the types of transistors are different if the types of the active layers of the transistors are different.

The pixel circuit 1121 is provided with the refresh control transistor T8 between the node Nd1 and the node Nd4, so that the frequency of data refresh may be controlled by the refresh control transistor T8. For example, in the data refresh phase, the refresh control transistor T8 is turned on, and at this time, the compensation signal obtained based on the data signal Vdata may be written into the control terminal of the driving sub-circuit 1121, so that the display content may be updated based on the written compensation signal. In the data holding phase, it is necessary to keep the currently displayed content unchanged (for example, displaying a static image), at this time, the refresh control transistor T8 is turned off, and the compensation signal obtained based on the data signal Vdata may not be written into the control terminal of the driving sub-circuit 1121. It can be seen that in the data holding phase, even though the data signals Vdata are different in respective sub-phases, however, because the data signal Vdata cannot be written into the control terminal of the driving sub-circuit 1121, the voltage at the control terminal of the driving sub-circuit 1121 is basically unchanged in the respective sub-phases, and the driving current generated by the driving sub-circuit 1121 is basically unchanged, so that the light emitting element 1110 emits light under the control of the same driving current in the whole data holding phase, thereby keeping the display content unchanged.

In addition, because the refresh control transistor T8 is an oxide transistor, the leakage current of the refresh control transistor T8 is small, which can ensure that the leakage of the voltage at the control terminal of the driving sub-circuit 1121 is small in the data holding phase, and ensure that the brightness difference of the light emitted by the light emitting element 1110 is small during the whole data holding phase, thereby improving the stability of the displayed image and improving the display quality of the display panel including the pixel circuit.

For example, as shown in FIG. 2A, the driving sub-circuit 1121 includes a driving transistor T3, the control terminal of the driving sub-circuit 1121 includes a gate electrode of the driving transistor T3, the first terminal of the driving sub-circuit 1121 includes a first electrode of the driving transistor T3, and the second terminal of the driving sub-circuit 1121 includes a second electrode of the driving transistor T3.

For example, as shown in FIG. 2A, the data writing sub-circuit 1122 includes a data writing transistor T4, a gate electrode of the data writing transistor T4 is configured to receive the scanning signal Ga1, a first electrode of the data writing transistor T4 is electrically connected to the data signal line, and a second electrode of the data writing transistor T4 is electrically connected to the first electrode of the driving transistor T3, that is, the second electrode of the data writing transistor T4 is electrically connected to the node Nd2.

For example, as shown in FIG. 2A, the storage sub-circuit 1123 includes a storage capacitor Cst, a first end of the storage capacitor Cst is electrically connected to the gate electrode of the driving transistor T3, that is, the first end of the storage capacitor Cst is electrically connected to the node Nd1, and a second end of the storage capacitor Cst is electrically connected to the voltage terminal VDD.

For example, as shown in FIG. 2A, the compensation sub-circuit 1124 includes a compensation transistor T2, a gate electrode of the compensation transistor T2 is configured to receive the compensation control signal Ga2, a second electrode of the compensation transistor T2 is electrically connected to the second electrode of the driving transistor T3, that is, the second electrode of the compensation transistor T2 is electrically connected to the node Nd3, and a first electrode of the compensation transistor T2 is electrically connected to the node Nd4.

For example, as shown in FIG. 2A, the first light emitting control sub-circuit 1125A includes a first light emitting control transistor T5, and the second light emitting control sub-circuit 1125B includes a second light emitting control transistor T6. For example, a gate electrode of the first light emitting control transistor T5 is configured to receive the light emitting control signal EM, a first electrode of the first light emitting control transistor T5 is connected to the voltage terminal VDD, and a second electrode of the first light emitting control transistor T5 is electrically connected to the first terminal of the driving sub-circuit 122, that is, the second electrode of the first light emitting control transistor T5 is electrically connected to the node Nd2; a gate electrode of the second light emitting control transistor T6 is configured to receive the light emitting control signal EM, a first electrode of the second light emitting control transistor T6 is electrically connected to the second terminal of the driving sub-circuit 122, that is, the first electrode of the second light emitting control transistor T6 is electrically connected to the node Nd3, and a second electrode of the second light emitting control transistor T6 is electrically connected to the first electrode of the light emitting element 1110.

It should be noted that the signal for controlling the first light emitting control transistor T5 and the signal for controlling the second light emitting control transistor T6 may also be different.

For example, as shown in FIG. 2A, the first reset sub-circuit 1126 includes a first reset transistor T1, and the second reset sub-circuit 1127 includes a second reset transistor T7. A first electrode of the first reset transistor T1 is electrically connected to the first reset voltage terminal Vinit1, a second electrode of the first reset transistor T1 is electrically connected to the node Nd4, and a gate electrode of the first reset transistor T1 is configured to receive the first reset control signal Re, a first electrode of the second reset transistor T7 is electrically connected to the second reset voltage terminal Vinit2, a second electrode of the second reset transistor T7 is electrically connected to the first electrode of the light emitting element 1110, and a gate electrode of the second reset transistor T7 is configured to receive the second reset control signal Rst.

For example, a voltage value of the second reset voltage of the second reset voltage terminal Vinit2 is greater than that of the first reset voltage of the first reset voltage terminal Vinit1. By increasing the second reset voltage of the second reset voltage terminal Vinit2, the carriers inside the light emitting element 1110 are reset, the defects of the carriers are reduced, the device stability is increased, and the problem of screen flicker is further ameliorated. However, the present disclosure is not limited to this, the voltage value of the second reset voltage of the second reset voltage terminal Vinit2 may also be equal to the voltage value of the first reset voltage of the first reset voltage terminal Vinit1.

For example, as shown in FIG. 2A, a first electrode of the refresh control transistor T8 is electrically connected to the node Nd4, a second electrode of the refresh control transistor T8 is electrically connected to the gate electrode of the driving transistor T3, that is, the second electrode of the refresh control transistor T8 is electrically connected to the node Nd1, and a gate electrode of the refresh control transistor T8 is configured to receive the refresh control signal Ga3.

For example, the first reset transistor T1, the compensation transistor T2, the driving transistor T3, the data writing transistor T4, the first light emitting control transistor T5, the second light emitting control transistor T6, and the second reset transistor T7 are all polysilicon thin-film transistors, such as low-temperature polysilicon (LTPS) thin-film transistors. The present disclosure is not limited to this, at least some selected from a group consisting of the first reset transistor T1, the compensation transistor T2, the driving transistor T3, the data writing transistor T4, the first light emitting control transistor T5, the second light emitting control transistor T6, and the second reset transistor T7 may be oxide transistors.

For example, the first reset transistor T1, the compensation transistor T2, the driving transistor T3, the data writing transistor T4, the first light emitting control transistor T5, the second light emitting control transistor T6, and the second reset transistor T7 are all P-type transistors. However, the present disclosure is not limited to this, at least some selected from a group consisting of the first reset transistor T1, the compensation transistor T2, the driving transistor T3, the data writing transistor T4, the first light emitting control transistor T5, the second light emitting control transistor T6, and the second reset transistor T7 may also be N-type transistors.

For example, one of the voltage output by the voltage terminal VDD and the voltage output by the voltage terminal VSS is a high voltage, and the other is a low voltage. For example, in the embodiment shown in FIG. 2A, the voltage output by the voltage terminal VDD is a constant positive voltage; and the voltage output by the voltage terminal VSS is a constant negative voltage. For example, in some examples, the voltage terminal VSS may be grounded.

For example, in practical implementation, in the embodiment of the present disclosure, the second reset voltage Vi output by the second reset voltage terminal Vinit2 and the voltage Vs output by the voltage terminal VSS may satisfy the following formula: Vi−Vs<VEL, so that the light emitting element 1110 can be prevented from emitting light in the non-light emitting phase. VEL represents the light emitting threshold voltage of the light emitting element 1110.

It should be noted that the pixel circuit may also be a circuit with other suitable structures, such as 7T1C (7 transistors and 1 capacitor), 8T2C, and other circuit structures, which will not be described here.

For example, as shown in FIG. 1, the display substrate 1 further includes a plurality of voltage lines, the plurality of voltage lines include a first voltage line VGH and a second voltage line VGL.

Figure 3:
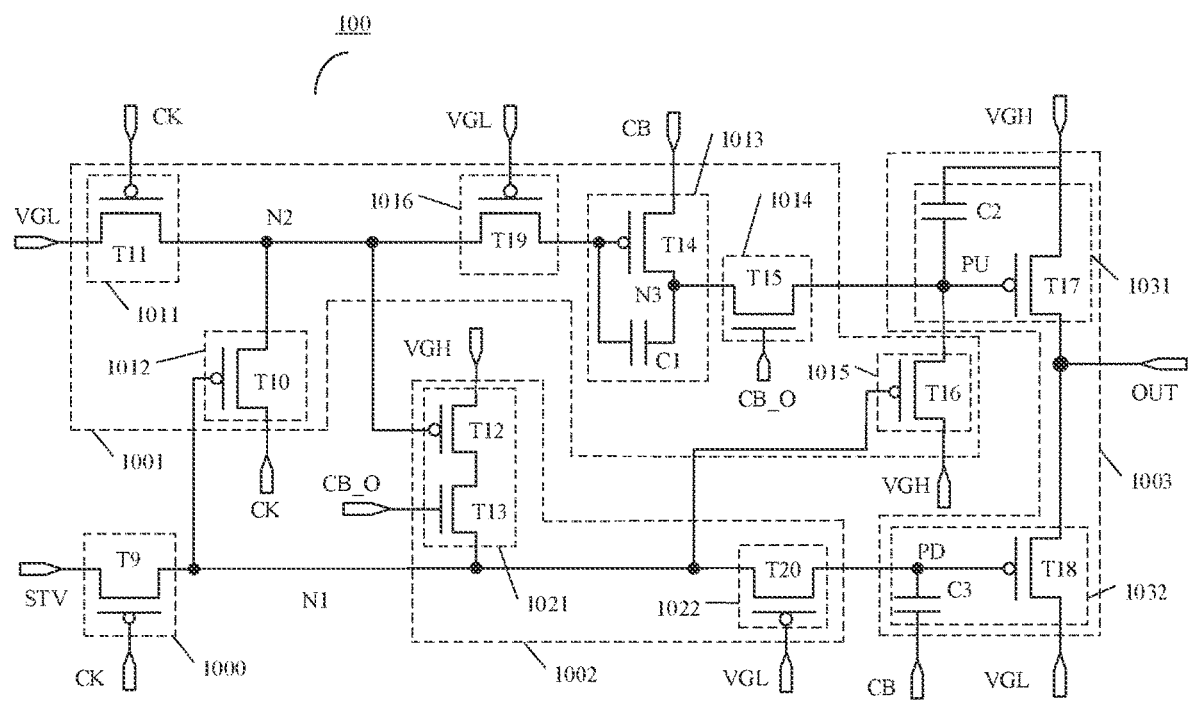
FIG. 3 is a structural diagram of a shift register unit provided by some embodiments of the present disclosure.

FIG. 3 is a structural diagram of a shift register unit provided by some embodiments of the present disclosure.

For example, as shown in FIG. 1, the gate driving circuit 130 includes a plurality of shift register units 100, for example, the plurality of shift register units 100 may be cascaded. The plurality of shift register units 100 include a first-stage shift register unit 100-1, a second-stage shift register unit 100-2, . . . an n-th stage shift register unit 100-N. The first-stage shift register unit 100-1 is used to output the output signal OUT_1, the second-stage shift register unit 100-2 is used to output the output signal OUT_2, and so on, and the n-th stage shift register unit 100-N is used to output the output signal OUT_N.

For example, as shown in FIG. 1 and FIG. 3, each shift register unit 100 includes an input circuit 1000, a first control circuit 1001, a second control circuit 1002, an output circuit 1003, a first control terminal CK, a second control terminal CB_O, a third control terminal CB, a trigger terminal STV, and an output terminal OUT.

For example, as shown in FIG. 3, the input circuit 1000 is electrically connected to the trigger terminal STV and the first node N1, respectively. For example, the input circuit 1000 is also electrically connected to the first control terminal CK to receive the first control signal, that is, the signal received by the first control terminal CK is the first control signal. The input circuit 1000 is configured to input the trigger signal received by the trigger terminal STV to the first node N1 under control of the first control signal. That is, under the control of the first control signal, when the input circuit 1000 is turned on, that is, when one terminal of the input circuit 1000 connected to the trigger terminal STV and the other terminal of the input circuit 1000 connected to the first node N1 are connected, the trigger signal can be transmitted to the first node N1.

For example, as shown in FIG. 3, the first control circuit 1001 is electrically connected with the first node N1, the second node N2, and the first output node PU, respectively. For example, the first control circuit 1001 is also electrically connected with the first control terminal CK, the second control terminal CB_O, and the third control terminal CB to receive the first control signal, the second control signal, and the third control signal, respectively. The signal received by the second control terminal CB_O is the second control signal, and the signal received by the third control terminal CB is the third control signal. The first control circuit 1001 is configured to write the first output control signal to the first output node PU under the control of the first control signal, the voltage of the first node N1, and the second control signal. For example, the first output control signal includes the third control signal.

For example, as shown in FIG. 3, the second control circuit 1002 is electrically connected with the first node N1, the second node N2, and the second output node PD, respectively, and the second control circuit 1002 is also electrically connected with the second control terminal CB_O to receive the second control signal. The second control circuit 1002 is configured to write the second output control signal to the second output node PD under the control of the second control signal and the voltage of the second node N2.

For example, as shown in FIG. 3, the output circuit 1003 is electrically connected to the first voltage line VGH, the second voltage line VGL, the first output node PU, the second output node PD, and the output terminal OUT, respectively. The output circuit 1003 is configured to write the first voltage signal provided by the first voltage line VGH or the second voltage signal provided by the second voltage line VGL into the output terminal OUT as an output signal under the control of the first output control signal and second output control signal.

For example, as shown in FIG. 1, the plurality of clock signal lines 140 include a first clock signal line NCK, a second clock signal line NCB_O, and a third clock signal line NCB.

For example, the first clock signal line NCK is configured to provide a first clock signal, the second clock signal line NCB_O is configured to provide a second clock signal, and the third clock signal line NCB is configured to provide a third clock signal.

For example, the plurality of shift register units 100 include the n-th stage shift register unit, and n is a positive integer.

The input circuit of the n-th stage shift register unit is connected to the first clock signal line NCK to receive the first clock signal as the first control signal. The first control circuit of the n-th stage shift register unit is connected with the first clock signal line NCK, the second clock signal line NCB_O, and the third clock signal line NCB to receive the first clock signal as the first control signal, receive the second clock signal as the second control signal, and receive the third clock signal as the third control signal, and the second control circuit of the n-th stage shift register unit is connected with the second clock signal line to receive the second clock signal as the second control signal. That is, the first control terminal CK of the n-th stage shift register unit is connected to the first clock signal line NCK, the second control terminal CB_O of the n-th stage shift register unit is connected to the second clock signal line NCB_O, and the third control terminal CB of the n-th stage shift register unit is connected to the third clock signal line NCB.

For example, the phase of the second clock signal is opposite to that of the third clock signal, that is, the phase of the second control signal is opposite to that of the third control signal.

For example, in some embodiments, n is an odd number or an even number, and the plurality of shift register units 100 further include an (n+1)-th stage shift register unit.

As shown in FIG. 1, the plurality of clock signal lines 140 further include a fourth clock signal line NCK_O, and the fourth clock signal line NCK_O is configured to provide a fourth clock signal. For example, the phase of the first clock signal is opposite to that of the fourth clock signal.

For example, the input circuit of the (n+1)-th stage shift register unit is connected with the third clock signal line NCB to receive the third clock signal as the first control signal, and the first control circuit of the (n+1)-th stage shift register unit is electrically connected with the first clock signal line NCK, the third clock signal line NCB, and the fourth clock signal line NCK_O, to receive the third clock signal as the first control signal, receive the fourth clock signal as the second control signal, and receive the first clock signal as the third control signal. The second control circuit of the (n+1)-th stage shift register unit is connected with the fourth clock signal line NCK_O to receive the fourth clock signal as the second control signal. That is, the first control terminal CK of the (n+1)-th stage shift register unit is connected to the third clock signal line NCB, the second control terminal CB_O of the (n+1)-th stage shift register unit is connected to the fourth clock signal line NCK_O, and the third control terminal CB of the (n+1)-th stage shift register unit is connected to the first clock signal line NCK.

For example, when n is an odd number, in this case, in the gate driving circuit, the first control terminal of an odd-stage shift register unit is electrically connected to the first clock signal line, the second control terminal of the odd-stage shift register unit is electrically connected to the second clock signal line, the third control terminal of the odd-stage shift register unit is electrically connected to the third clock signal line, the first control terminal of an even-stage shift register unit is electrically connected to the third clock signal line, the second control terminal of the even-stage shift register unit is electrically connected to the fourth clock signal line, the third control terminal of the even-stage shift register unit is electrically connected to the first clock signal line. When n is an even number, in this case, in the gate driving circuit, the first control terminal of the even-stage shift register unit is electrically connected to the first clock signal line, the second control terminal of the even-stage shift register unit is electrically connected to the second clock signal line, the third control terminal of the even-stage shift register unit is electrically connected to the third clock signal line, the first control terminal of the odd-stage shift register units is electrically connected to the third clock signal line, the second control terminal of the odd-stage shift register unit is electrically connected to the fourth clock signal line, the third control terminal of the odd-stage shift register unit is electrically connected to the first clock signal line.

The shift register unit provided by the embodiments of the present disclosure will be described below with reference to FIG. 3.

For example, the first voltage line VGH may output a first voltage signal VH with a first level, and the second voltage line VGL may output a second voltage signal VL with a second level. That is, the first voltage signal VH is a high-level signal (such as 5V, 10V, or other voltages), and the second voltage signal VL is a low-level signal (such as 0V, −1V, or other voltages). For example, in some embodiments, the second voltage line VGL may be grounded. For example, both the first voltage signal VH and the second voltage signal VL are DC signals. For example, the first level and the second level are different, for example, are opposite to each other. In some examples, the first level is a high level and the second level is a low level. However, the present disclosure is not limited to this, the first level may be a low level and the second level may be a high level according to actual application requirements. In the description of the present disclosure, taking the first level as a high level and the second level as a low level as an example.

It should be noted that the low-level signal and the high-level signal are relative, and the voltage value of the low-level signal is smaller than that of the high-level signal. In different embodiments, the voltage values of high-level signals may be different, and the voltage values of low-level signals may also be different.

For example, as shown in FIG. 3, the first control circuit 1001 is configured to output the first output control signal to the first output node PU to control the output circuit 1003 to output the first voltage signal VH to the output terminal OUT in the first phase, and the second control circuit 1002 is configured to output the second output control signal to the second output node PD to control the output circuit 1003 to output the second voltage signal VL to the output terminal OUT in the second phase. The output signal includes the first voltage signal VH in the first phase and the second voltage signal VL in the second phase.

For example, as shown in FIG. 3, the first control circuit 1001 is also electrically connected to the first voltage line VGH, the second voltage line VGL, and the input circuit 1000. For example, the first control circuit 1001 may include a first control input sub-circuit 1011, a second control input sub-circuit 1012, a bootstrap sub-circuit 1013, a first control output sub-circuit 1014, and a second control output sub-circuit 1015.

For example, as shown in FIG. 3, the first control input sub-circuit 1011 is electrically connected to the second voltage line VGL and the second node N2, respectively. For example, the first control input sub-circuit 1011 is also electrically connected to the first control terminal CK to receive the first control signal. The first control input sub-circuit 1011 is configured to write the second voltage signal VL to the second node N2 under the control of the first control signal.

For example, as shown in FIG. 3, the second control input sub-circuit 1012 is electrically connected to the input circuit 1000 and the second node N2, respectively. For example, the second control input sub-circuit 1012 is also electrically connected to the first control terminal CK to receive the first control signal. The second control input sub-circuit 1012 is configured to write the first control signal to the second node N2 under the control of the trigger signal.

For example, as shown in FIG. 3, the bootstrap sub-circuit 1013 is electrically connected to the second node N2 and the third node N3, respectively. For example, the bootstrap sub-circuit 1013 is also electrically connected to the third control terminal CB to receive the third control signal. The bootstrap sub-circuit 1013 is configured to write the third control signal to the third node N3 under the control of the voltage of the second node N2.

For example, as shown in FIG. 3, the first control output sub-circuit 1014 is electrically connected to the third node N3 and the first output node PU, respectively. For example, the first control output sub-circuit 1014 is also electrically connected to the second control terminal CK_O to receive the second control signal. The first control output sub-circuit 1014 is configured to write the third control signal written to the third node N3 to the first output node PU under the control of the second control signal.

For example, as shown in FIG. 3, the second control output sub-circuit 1015 is electrically connected to the first node N1, the first voltage line VGH, and the first output node PU, respectively, and is configured to write the first voltage signal VH into the first output node PU under the control of the voltage of the first node N1. For example, the first output control signal further includes the first voltage signal VH.

For example, the input circuit 1000 includes a first terminal connected to the trigger terminal STV and a second terminal connected to the first node N1. The second control input sub-circuit 1012 may be electrically connected to the second terminal of the input circuit 1000, that is, the second control input sub-circuit 1012 is connected to the first node N1, or the second control input sub-circuit 1012 may be electrically connected to the first terminal of the input circuit 1000, that is, the second control input sub-circuit 1012 is connected to the trigger terminal SVT. In the example shown in FIG. 3, the second control input sub-circuit 1012 may be electrically connected to the second terminal of the input circuit 1000, that is, the second control input sub-circuit 1012 is electrically connected to the first node N1.

For example, as shown in FIG. 3, the input circuit 1000 includes an input transistor T9, a first electrode of the input transistor T9 is electrically connected to the trigger terminal STV, a second electrode of the input transistor T9 is electrically connected to the first node N1, and a gate electrode of the input transistor T9 is configured to receive the first control signal, that is, the gate electrode of the input transistor T9 is electrically connected to the first control terminal CK to receive the first control signal.

For example, as shown in FIG. 3, the first control input sub-circuit 1011 includes a first control input transistor T11, a first electrode of the first control input transistor T11 is electrically connected to the second voltage line VGL, a second electrode of the first control input transistor T11 is electrically connected to the second node N2, and a gate electrode of the first control input transistor T11 is configured to receive the first control signal, that is, the gate electrode of the first control input transistor T11 is electrically connected to the first control terminal CK to receive the first control signal, so that the first control input transistor T11 is turned on or off under the control of the first control signal.

For example, as shown in FIG. 3, the second control input sub-circuit 1012 includes a second control input transistor T10, a first electrode of the second control input transistor T10 is configured to receive the first control signal, that is, the first electrode of the second control input transistor T10 is electrically connected to the first control terminal CK to receive the first control signal, a second electrode of the second control input transistor T10 is electrically connected to the second node N2, and a gate electrode of the second control input transistor T10 is electrically connected to the first node N1, so that the second control input transistor T10 is turned on or off under the control of the voltage of the first node N1.

For example, as shown in FIG. 3, the bootstrap sub-circuit 1013 includes a first capacitor C1 and a bootstrap transistor T14, a gate electrode of the bootstrap transistor T14 is electrically connected to the second node N2, a second electrode of the bootstrap transistor T14 is electrically connected to the third node N3, and a first electrode of the bootstrap transistor T14 is configured to receive the third control signal, that is, the first electrode of the bootstrap transistor T14 is electrically connected to the third control terminal CB to receive the third control signal. A first end of the first capacitor C1 is connected to the second node N2, and a second end of the first capacitor C1 is electrically connected to the third node N3. For example, when the level of the second node N2 is at the second level, that is, when the second voltage signal VL is written into the second node N2, under the control of the level of the second node N2, the bootstrap transistor T14 is turned on, and the third control signal output by the third control terminal CB is transmitted to the third node N3. When the third control signal jumps from the first level to the second level, and the voltage of the third node N3 also jumps from the first level to the second level, the first capacitor C1 generates a bootstrap effect, so that the level of the second node N2 changes with the change of the level of the third node N3, that is, the level of the second node N2 also jumps, so that the level of the second node N2 is lower than the second level (for example, at this time, the level of the second node N2 is (2*second level-first level)), thus the third control signal at the second level may be output via the bootstrap transistor T14 and written into the third node N3.

For example, as shown in FIG. 3, the first control output sub-circuit 1014 includes a first control output transistor T15, a gate electrode of the first control output transistor T15 is configured to receive a second control signal, that is, the gate electrode of the first control output transistor T15 is electrically connected with the second control terminal CB_O to receive the second control signal, and the first control output transistor T15 is turned on or off under the control of the second control signal; a first electrode of the first control output transistor TIS is electrically connected to the third node N3, and a second electrode of the first control output transistor T15 is electrically connected to the first output node PU.

For example, as shown in FIG. 3, the second control output sub-circuit 1015 includes a second control output transistor T16. A gate electrode of the second control output transistor T16 is electrically connected to the first node N1, the second control output transistor T16 is turned on or off under the control of the voltage of the first node N1, a first electrode of the second control output transistor T16 is electrically connected to the first voltage line VGH, and a second electrode of the second control output transistor T16 is electrically connected to the first output node PU.

If the shift register unit shown in FIG. 3 is the n-th stage shift register unit, the input circuit 1000, the first control input sub-circuit 1011, and the second control input sub-circuit 1012 are all electrically connected to the first clock signal line NCK to receive the first clock signal as the first control signal, that is, the gate electrode of the first control input transistor T11, the first electrode of the second control input transistor T10, and the gate electrode of the input transistor T9 are all electrically connected to the first clock signal line NCK. The bootstrap sub-circuit 1013 is electrically connected to the third clock signal line NCB to receive the third clock signal as the third control signal, that is, the first electrode of the bootstrap transistor T14 is electrically connected to the third clock signal line NCB. The first control output sub-circuit 1014 is electrically connected to the second clock signal line NCB_O to receive the second clock signal as the second control signal, that is, the gate electrode of the first control output transistor T15 is electrically connected to the second clock signal line NCB_O.

For example, as shown in FIG. 3, the first control circuit 1001 further includes a first isolation sub-circuit 1016, the first isolation sub-circuit 1016 is electrically connected to the second node N2, the bootstrap sub-circuit 1013, and the second voltage line VGL, respectively, and is configured to isolate the second node N2 from the bootstrap sub-circuit 1013. In this case, the bootstrap sub-circuit 1013 is connected to the second node N2 through the first isolation sub-circuit 1016. For example, in general, the first isolation sub-circuit 1016 is in a turn-on state, that is, one terminal of the first isolation sub-circuit 1016 connected to the second node N2 and the other terminal of the first isolation sub-circuit 1016 connected to the bootstrap sub-circuit 1013 are connected. When the first capacitor C1 in the bootstrap sub-circuit 1013 generates a bootstrap effect, for example, when the voltage of the gate electrode of the bootstrap transistor T14 in the bootstrap sub-circuit 1013 suddenly drops (or rises), the first isolation sub-circuit 1016 switches from the turn-on state to the turn-off state, thus preventing the voltage of the second node N2 from changing with the voltage of the gate electrode of the bootstrap transistor T14, and further avoiding affecting the performance of the transistor connected to the second node N2.

For example, as shown in FIG. 3, the first isolation sub-circuit 1016 includes a first isolation transistor T19, a first electrode of the first isolation transistor T19 is electrically connected to the second node N2, a second electrode of the first isolation transistor T19 is electrically connected to the bootstrap sub-circuit 1013, for example, the second electrode of the first isolation transistor T19 is electrically connected to the gate electrode of the bootstrap transistor T14, and a gate electrode of the first isolation transistor T19 is electrically connected to the second voltage line VGL.

For example, as shown in FIG. 3, the second control circuit 1002 is also electrically connected to the first voltage line VGH, and the second control circuit 1002 includes a third control input sub-circuit 1021. For example, the third control input sub-circuit 1021 is electrically connected to the first node N1, the second node N2, and the first voltage line VGH, respectively, and the third control input sub-circuit 1021 is also electrically connected to the second control terminal CB_O to receive the second control signal. The third control input sub-circuit 1021 is configured to write the first voltage signal VH to the first node N1 under the control of the voltage of the second node N2 and the second control signal.

For example, as shown in FIG. 3, the third control input sub-circuit 1021 includes a third control input transistor T12 and a fourth control input transistor T13. A first electrode of the third control input transistor T12 is electrically connected to the first voltage line VGH, a second electrode of the third control input transistor T12 is electrically connected to a first electrode of the fourth control input transistor T13, a gate electrode of the third control input transistor T12 is electrically connected to the second node N2, and the third control input transistor T12 is turned on or off under control of the voltage of the second node N2. A second electrode of the fourth control input transistor T13 is electrically connected to the first node N1, and a gate electrode of the fourth control input transistor T13 is electrically connected to the second control terminal CB_O to receive the second control signal.

If the shift register unit shown in FIG. 3 is the n-th stage shift register unit, the third control input sub-circuit 1021 is electrically connected to the second clock signal line NCB_O to receive the second clock signal as the second control signal, that is, the gate electrode of the fourth control input transistor T13 is electrically connected to the second clock signal line NCB_O.

For example, the fourth control input transistor T13 and the first control output transistor T15 are both oxide transistors. For example, the material of the active layer of the fourth control input transistor T13 and the material of the active layer of the first control output transistor T15 may be indium gallium zinc oxide, so that the leakage current of the fourth control input transistor T13 and the leakage current of the first control output transistor TIS are both small.

For example, in some embodiments, the fourth control input transistor T13 and the first control output transistor T15 are both N-type transistors.

For example, as shown in FIG. 3, the second control circuit 1002 is also electrically connected to the second voltage line VGL, and the second control circuit 1002 further includes a second isolation sub-circuit 1022, the second isolation sub-circuit 1022 is electrically connected to the first node N1, the second output node PD, and the second voltage line VGL, respectively, and the second isolation sub-circuit 1022 is configured to isolate the first node N1 and the second output node PD.

For example, in general, the second isolation sub-circuit 1022 is in a turn-on state, that is, one terminal of the second isolation sub-circuit 1022 connected to the first node N1 and the other terminal of the second isolation sub-circuit 1022 connected to the second output node PD are connected, when the voltage of the second output node PD fluctuates, for example, because of the bootstrap effect, the voltage of the second output node PD suddenly drops (or rises), at this time, the second isolation sub-circuit 1022 switches from the turn-on state to the turn-off state, so that the voltage of the first node N1 is prevented from fluctuating with the voltage of the second output node PD, and the transistor connected to the first node N1 is prevented from being abnormal, thus avoiding output abnormality. For example, if the voltage of the first node N1 decreases as the voltage of the second output node PD decreases, the second control output sub-circuit 1015 may be turned on, so that the first voltage signal VH is transmitted to the first output control node PU when the first voltage signal VH should not be transmitted to the first output control node PU, which may cause the first output sub-circuit 1031 to be turned on, thus causing output abnormality.

For example, as shown in FIG. 3, the second isolation sub-circuit 1022 includes a second isolation transistor T20, a first electrode of the second isolation transistor T20 is electrically connected to the first node N1, a second electrode of the second isolation transistor T20 is electrically connected to the second output node PD, and a gate electrode of the second isolation transistor T20 is electrically connected to the second voltage line VGL.

For example, as shown in FIG. 3, the output circuit 1003 includes a first output sub-circuit 1031 and a second output sub-circuit 1032. The first output sub-circuit 1031 is electrically connected to the first output node PU, the first voltage line VGH, and the output terminal OUT, respectively, and is configured to store the first output control signal, and write the first voltage signal VH into the output terminal OUT in the first phase under the control of the first output control signal; the second output sub-circuit 1032 is electrically connected to the second output node PD, the second voltage line VGL, and the output terminal OUT, respectively, and is configured to store the second output control signal, and write the second voltage signal VL to the output terminal OUT in the second phase under the control of the second output control signal.

For example, as shown in FIG. 3, the output circuit 1003 is further configured to be electrically connected with the third control terminal CB to receive the third control signal.

For example, as shown in FIG. 3, the first output sub-circuit 1031 includes a first output transistor T17 and a second capacitor C2. A gate electrode of the first output transistor T17 is electrically connected to the first output node PU, a first electrode of the first output transistor T17 is electrically connected to the first voltage line VGH, a second electrode of the first output transistor T17 is electrically connected to the output terminal OUT, a first end of the second capacitor C2 is electrically connected to the first output node PU, and a second end of the second capacitor C2 is electrically connected to the first voltage line VGH. The second output sub-circuit 1032 includes a second output transistor T18 and a third capacitor C3. A gate electrode of the second output transistor T18 is electrically connected to the second output node PD, a first electrode of the second output transistor T18 is electrically connected to the second voltage line VGL, and a second electrode of the second output transistor T18 is electrically connected to the output terminal OUT, a first end of the third capacitor C3 is electrically connected to the first output node, and a second end of the third capacitor C3 is electrically connected to the third control terminal CB to receive the third control signal.

For example, in some embodiments, the input transistor T9, the second control input transistor T10, the first control input transistor T11, the third control input transistor T12, the bootstrap transistor T14, the second control output transistor T16, the first output transistor T17, the second output transistor T18, the first isolation transistor T19, and the second isolation transistor T20 are all P-type transistors.

If the shift register unit shown in FIG. 3 is the n-th stage shift register unit, the second output sub-circuit 1032 is electrically connected to the third clock signal line NCB to receive the third clock signal as the third control signal, that is, the second end of the third capacitor C3 is electrically connected to the third clock signal line NCB.

For example, in the example shown in FIG. 3, the first electrode of the first output transistor T17, the first electrode of the second control output transistor T16, and the first electrode of the third control input transistor T12 are all electrically connected to the same first voltage line VGH, and the first electrode of the first control input transistor T11, the gate electrode of the first isolation transistor T19, the gate electrode of the second isolation transistor T20, and the first electrode of the second output transistor T18 are all electrically connected to the same second voltage line VGL, thus reducing the number of voltage lines and saving the wiring space. However, the present disclosure is not limited to this, and at least part selected from a group consisting of the first electrode of the first output transistor T17, the first electrode of the second control output transistor T16, and the first electrode of the third control input transistor T12 may be connected to other provided voltage terminal, as long as the other provided voltage terminal outputs a high-level voltage signal, the high-level voltage signal output by the other provided voltage terminal may be the same as or different from the first voltage signal output by the first voltage line VGH. Similarly, at least part selected from a group consisting of the first electrode of the first control input transistor T11, the gate electrode of the first isolation transistor T19, the gate electrode of the second isolation transistor T20, and the first electrode of the second output transistor T18 may be connected to other provided voltage terminal, as long as the other provided voltage terminal outputs a low-level voltage signal, the low-level voltage signal output by the other provided voltage terminal may be the same as or different from the second voltage signal output by the second voltage line VGL.

For example, in the embodiments of the present disclosure, for the n-th stage shift register unit, all electrodes that need to be electrically connected to the first clock signal line are part of the first control terminal CK, all electrodes that need to be electrically connected to the second clock signal line are part of the second control terminal CB_O, and all electrodes that need to be electrically connected to the third clock signal line are part of the third control terminal CB; similarly, for the (n+1)-th stage shift register unit, all electrodes that need to be electrically connected to the third clock signal line are part of the first control terminal CK, all electrodes that need to be electrically connected to the fourth clock signal line are part of the second control terminal CB_O, and all electrodes that need to be electrically connected to the first clock signal line are part of the third control terminal CB. Taking the shift register unit shown in FIG. 3 as the n-th stage shift register unit as an example, the gate electrode of the first control input transistor T11, the first electrode of the second control input transistor T10, and the gate electrode of the input transistor T9 are all part of the first control terminal CK, the first electrode of the bootstrap transistor T14 and the second end of the third capacitor C3 are both part of the second control terminal CB_O, and the gate electrode of the fourth control input transistor T13 and the gate electrode of the first control output transistor T15 are both part of the third control terminal CB.

In the embodiments of the present disclosure, when the display panel including the gate driving circuit is in the low-frequency display mode, it is necessary to set the clock signal high in the data holding phase (at this time, the output of the gate driving circuit needs to be kept at a low level) to reduce the overall power consumption of the gate driving circuit, and at this phase, the first output transistor T17 needs to be kept to be turned off and the second output transistor T18 needs to be kept to be turned on, that is, the first output control node PU needs to be in a high level state, and the second output control node PD needs to be in a low level state. In order to achieve this purpose, the fourth control input transistor T13 and the first control output transistor T15 are oxide transistors, due to the low leakage characteristics of the oxide transistor, the stability of the first output control node PU and the second output control node PD can be ensured, thus ensuring the stability of the output of the gate driving circuit. Therefore, in the low-frequency display mode, the overall power consumption of the gate driving circuit can be reduced while ensuring that the output of the gate driving circuit is stable.

It should be noted that, as shown in FIG. 3, although the second control output transistor T16 is electrically connected to the first output control node PU and the input transistor T9 and the second isolation transistor T20 are both electrically connected to the second output control node PD, if the second control output transistor T16 generates current leakage, the second control output transistor T16 will transmit the first voltage signal VH to the first output control node PU, thus the first output control node PU is still in a high level state, and the voltage at the first output control node PU will not change to a low level, so that the turn-off state of the first output transistor T17 will not be affected; if the input transistor T9 and the second isolation transistor T20 generate current leakage, the input transistor T9 and the second isolation transistor T20 will transmit the low-level signal to the second output control node PD, so that the second output control node PD is still in a low-level state, and the voltage at the second output control node PD will not become a high level, thus not affecting the turn-on state of the second output transistor T18. It can be seen that, the current leakage of the second control output transistor T16, the input transistor T9, and the second isolation transistor T20 will not adversely affect the states of the first output control node PU and the second output control node PD, so that the second control output transistor T16, the input transistor T9, and the second isolation transistor T20 need not be set as oxide transistors. However, the present disclosure is not limited to this, and any transistor in the shift register unit may be set as an oxide transistor according to actual application requirements.

For example, the high level of the first control signal, the high level of the second control signal, and the high level of the third control signal are the same as the level of the first voltage signal VH, and the low level of the first control signal, the low level of the second control signal, and the low level of the third control signal are the same as the level of the second voltage signal VL.

It should be noted that the high level of the first control signal, the high level of the second control signal, and the high level of the third control signal may also be different from the level of the first voltage signal VH, and the low level of the first control signal, the low level of the second control signal, and the low level of the third control signal may also be different from the level of the second voltage signal VL, so long as the first control signal, the second control signal, and the third control signal can perform their own functions, and the present disclosure does not limit the levels of the first control signal, the second control signal, and the third control signal.

For example, in some embodiments of the present disclosure, the types of the first output transistor T17 and the second output transistor T18 are opposite to those of the fourth control input transistor T13 and the first control output transistor T15.

For example, as shown in FIG. 1, the display substrate 1 may further include a trigger signal line NGSTV provided on the base substrate 1. When the plurality of shift register units 100 are cascaded, the trigger terminal of the first-stage shift register unit among the plurality of shift register units 100 is electrically connected with the trigger signal line NGSTV to receive the signal provided by the trigger signal line NGSTV as the trigger signal of the first-stage shift register unit. That is, the first electrode of the input transistor T9 in the first-stage shift register unit 100 is configured to be connected with the trigger signal line NGSTV. For example, except the first-stage shift register unit, the trigger terminal STV of a shift register unit 100 is connected to the output terminal OUT of the previous-stage shift register unit 100 to receive the output signal output from the previous-stage shift register unit 100 as the trigger signal. For example, as shown in FIG. 1, the trigger terminal STV of the second-stage shift register unit 100-2 is connected to the output terminal OUT_1 of the first-stage shift register unit 100-1. For example, in some embodiments, the plurality of shift register units further include an m-th stage shift register unit and a (m+1)-th stage shift register unit, m is a positive integer, and the trigger terminal of the (m+1)-th stage shift register unit is connected with the output terminal of the m-th stage shift register unit to receive the output signal output by the output terminal of the m-th stage shift register unit as the trigger signal of the (m+1)-th stage shift register unit.

It should be noted that the display substrate 1 may further include a trigger signal line connected to the first-stage shift register unit of the light emitting control gate driving circuit and a trigger signal line connected to the first-stage shift register unit of the scanning control gate driving circuit, and the embodiments of the present disclosure are not limited to this.

Figure 4A:
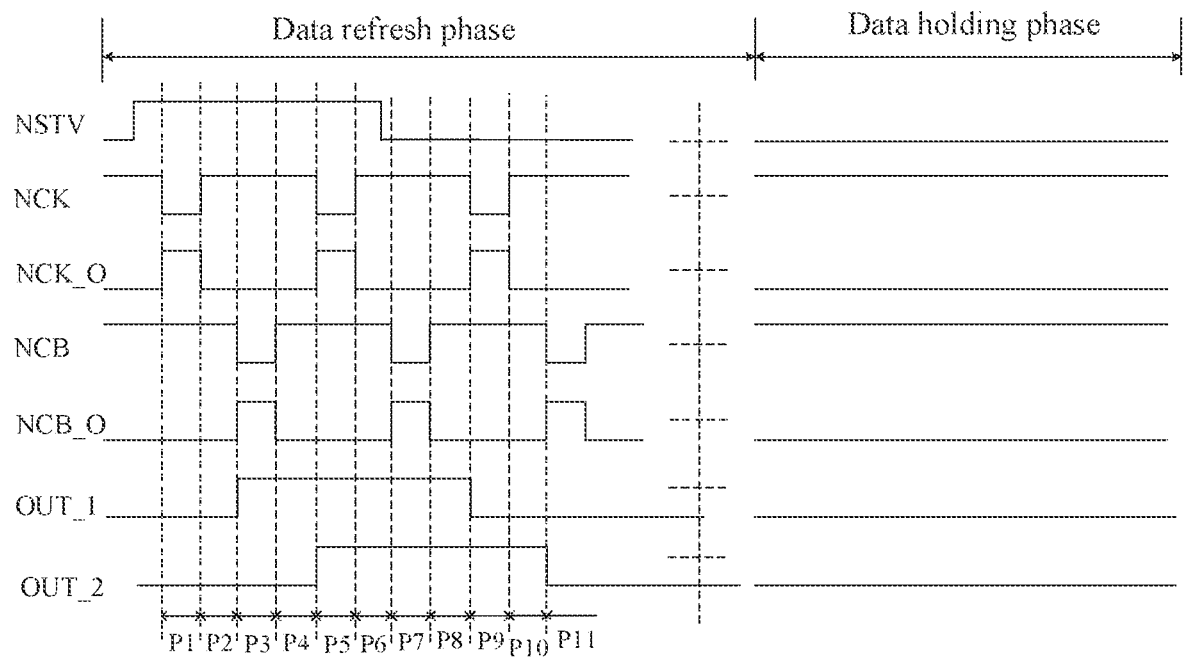
FIG. 4A is a driving timing diagram of a shift register unit provided by at least one embodiment of the present disclosure.

FIG. 4A is a driving timing diagram of a shift register unit provided by at least one embodiment of the present disclosure. The working principle of the shift register unit provided by the embodiment of the present disclosure will be described below by taking the shift register unit shown in FIG. 3 and the driving timing shown in FIG. 4A as examples. For example, the working principle of the first-stage shift register unit 100-1 is explained, and the working principles of the other stages of shift register units 100 are similar to that of the first-stage shift register unit 100-1, so the details will not be repeated. In the following description, for example, the first control terminal of the first-stage shift register unit 100-1 is electrically connected to the first clock signal line NCK, the second control terminal of the first-stage shift register unit 100-1 is electrically connected to the second clock signal line NCB_O, and the third control terminal of the first-stage shift register unit 100-1 is electrically connected to the third clock signal line NCB.

For example, as shown in FIG. 4A, a time period of one frame (i.e., a frame period) in the working process of the shift register unit includes a data refresh phase, and the data refresh phase includes nine working phases, namely, a first working phase P1, a second working phase P2, a third working phase P3, a fourth working phase P4, a fifth working phase P5, a sixth working phase P6, a seventh working phase P7, an eighth working phase P8, and a ninth working phase P9, respectively, and FIG. 4A shows the timing waveform of each signal in each phase.

In addition, in FIG. 4A, NCK represents both the first clock signal line and the first clock signal, NCB_O represents both the second clock signal line and the second clock signal, NCB represents both the third clock signal line and the third clock signal, and NCK_O represents both the fourth clock signal line and the fourth clock signal. VGH represents both the first voltage line and the first voltage signal provided by the first voltage line, for example, the first voltage signal is a DC high level, and VGL represents both the second voltage line and the second voltage signal provided by the second voltage line, for example, the second voltage signal is a DC low level.

In the first working phase P1, as shown in FIG. 4A, the first clock signal NCK is at a low level, the trigger signal NGSTV output by the trigger signal line NGSTV is at a high level, the second clock signal NCB_O is at a low level, and the third clock signal NCB is at a high level.

Because the first clock signal NCK is at a low level, the input transistor T9 and the first control input transistor T11 are turned on. Because the trigger signal NGSTV is at a high level, the turned-on input transistor T9 transmits the high-level trigger signal NGSTV to the first node N1, so that the level of the first node N1 becomes a high level, and thus the second control input transistor T10 and the second control output transistor T16 are turned off. In addition, because the second voltage signal VGL is at a low level, the second isolation transistor T20 is turned on, and the high-level trigger signal NGSTV is also transmitted to the second output control node PD, so that the level of the second output control node PD becomes a high level, so that the second output transistor T18 is turned off. In addition, the turned-on first control input transistor T11 transmits the low-level second voltage signal VGL to the second node N2, so that the level of the second node N2 becomes a low level, and therefore the third control input transistor T12 is turned on. In addition, because the second voltage signal VGL is at a low level, the first isolation transistor T19 is turned on, and the low-level second voltage signal VGL is also transmitted to the gate electrode of the bootstrap transistor T14, so that the bootstrap transistor T14 is turned on. Because the third clock signal NCB is at a high level, the bootstrap transistor T14 may transmit the high-level third clock signal NCB to the third node N3, so that the voltage of the third node N3 is at a high level. Because the second clock signal NCB_O is at a low level, the fourth control input transistor T13 and the first control output transistor T15 are turned off. In addition, because of the storage function of the second capacitor C2, the level of the first output control node PU may be kept at the previous high level, so that the first output transistor T17 is turned off. In the first working phase P1, because both the first output transistor T17 and the second output transistor T18 are turned off, the output signal OUT_1 output by the output terminal OUT_1 of the shift register unit 100-1 keeps at the previous low level.

In the second working phase P2, as shown in FIG. 4A, the first clock signal NCK changes from a low level to a high level, the trigger signal NGSTV is at a high level, the second clock signal NCB_O is at a low level, and the third clock signal NCB remains at a high level.

Because the first clock signal NCK is at a high level, the input transistor T9 and the first control input transistor T11 are turned off. Because the second clock signal NCB_O is still at a low level and the third clock signal NCB is still at a high level, the states of other transistors in the shift register unit are the same as the states of other transistors in the first working phase P1, respectively. In addition, the states of respective nodes (i.e., the first node N1, the second node N2, the third node N3, the first output control node PU, and the second output control node PD) are the same as the states of respective nodes in the first working phase P1, respectively. Therefore, in the second working phase P2, because the first output transistor T17 and the second output transistor T18 are also turned off, the output signal OUT_1 output by the output terminal OUT_1 of the shift register unit 100-1 keeps at the previous low level.

In the third working phase P3, as shown in FIG. 4A, the first clock signal NCK is at a high level, the trigger signal NGSTV is at a high level, the second clock signal NCB_O changes from a low level to a high level, and the third clock signal NCB changes from a high level to a low level.

Because the first clock signal NCK is at a high level, the input transistor T9 and the first control input transistor T11 are turned off. Because of the storage function of the first capacitor C1, the second node N2 may continue to remain at a low level, so that the third control input transistor T12 and the bootstrap transistor T14 are turned on. Because the second clock signal NCB_O is at a high level, the fourth control input transistor T13 is turned on, and the high-level first voltage signal VGH is transmitted to the first node N1 through the turned-on third control input transistor T12 and the turned-on fourth control input transistor T13, so that the level of the first node N1 continues to remain at a high level, so that the second control input transistor T10, the second control output transistor T16, and the second output transistor T18 are turned off.

Because the third clock signal NCB is at a low level, the bootstrap transistor T14 may transmit the low-level third clock signal NCB to the third node N3, so that the voltage of the third node N3 changes from a high level to a low level. Based on the bootstrap effect of the first capacitor C1, the voltage of the gate electrode of the bootstrap transistor T14 is further lowered from the low level, so that the gate-source voltage of the first isolation transistor T19 is greater than its threshold voltage, and therefore, the first isolation transistor T19 is turned off, thereby isolating the second node N2 from the gate electrode of the bootstrap transistor T14, preventing the second node N2 from being affected, and improving the output stability. Meanwhile, due to the bootstrap effect of the first capacitor C1, the voltage of the gate electrode of the bootstrap transistor T14 is further lowered from the low level, and the output capability of the bootstrap transistor T14 is enhanced, so that the low-level third clock signal NCB can be completely output to the third node N3, that is, the voltage of the third node N3 may be the third clock signal NCB.

Because the second clock signal NCB_O is at a high level, the first control output transistor T15 is turned on, and the voltage of the third node N3 (the third clock signal NCB is at a low level) is transmitted to the first output control node PU through the turned-on first control output transistor T15, so that the voltage of the first output control node PU becomes at a low level, and the first output transistor T17 is turned on. At this time, the first voltage signal VGH is transmitted to the output terminal via the turned-on first output transistor T17, so that the output signal OUT_1 output by the output terminal OUT_1 of the shift register unit 100-1 in the third working phase P3 is the high-level first voltage signal VGH.

In the fourth working phase P4, as shown in FIG. 4A, the first clock signal NCK is at a high level, the trigger signal NGSTV is at a high level, the second clock signal NCB_O changes from a high level to a low level, and the third clock signal NCB changes from a low level to a high level.

Because the first clock signal NCK is at a high level, the input transistor T9 and the first control input transistor T11 are turned off. The second clock signal NCB_O is at a low level, so that the fourth control input transistor T13 and the first control output transistor T15 are turned off. The first control output transistor T15 is turned off, thereby avoiding the fluctuation of the voltage of the first output control node PU caused by the change of the voltage of the third node N3. Because of the storage function of the first capacitor C1, the gate electrode of the bootstrap transistor T14 may continue to be kept at a low level, so that the bootstrap transistor T14 is turned on. Because the third clock signal NCB is at a high level, the level of the third node N3 changes from a low level to a high level. Based on the bootstrap effect of the first capacitor C1, the voltage of the gate electrode of the bootstrap transistor T14 is pulled up, but the voltage of the gate electrode of the bootstrap transistor T14 still makes the bootstrap transistor T14 be turned on. At this time, the voltage of the gate electrode of the bootstrap transistor T14 may be the same as the voltage of the gate electrode of the bootstrap transistor T14 in the second working phase P2.

Because of the storage function of the third capacitor C3, the level of the second output control node PD may be kept at a high level, so that the second output transistor T18 is turned off. Because of the storage function of the second capacitor C2, the level of the first output control node PU may be kept at a low level, so that the first output transistor T17 is kept in a turn-on state, and the turned-on first output transistor T17 outputs the high-level first voltage signal VGH to the output terminal, so the output signal OUT_1 output by the output terminal OUT_1 of the shift register unit 100-1 in the fourth working phase P4 is the high-level first voltage signal VGH.

In the fifth working phase P5, as shown in FIG. 4A, the first clock signal NCK changes from a high level to a low level, the trigger signal NGSTV is at a high level, the second clock signal NCB_O is at a low level, and the third clock signal NCB is at a high level.

Because the first clock signal NCK is at a low level, the input transistor T9 and the first control input transistor T11 are turned on, and the turned-on input transistor T9 transmits the high-level trigger signal NGSTV to the first node N1, so that the level of the first node N1 is at a high level, the second control input transistor T10 and the second control output transistor T16 are turned off. The turned-on first control input transistor T11 transmits the low-level second voltage signal VGL to the second node N2, so that the level of the second node N2 is a low level, and the third control input transistor T12 is turned on. Because the second voltage signal VGL is at a low level, the first isolation transistor T19 is turned on, and the low-level second voltage signal VGL is also transmitted to the gate electrode of the bootstrap transistor T14, so that the bootstrap transistor T14 is turned on. Because the third clock signal NCB is at a high level, the bootstrap transistor T14 may transmit the high-level third clock signal NCB to the third node N3, so that the voltage of the third node N3 is at a high level. Because the second clock signal NCB_O is at a low level, the fourth control input transistor T13 and the first control output transistor TIS are turned off. Because the first control output transistor T15 is turned off, thus avoiding that the voltage of the first output control node PU fluctuates due to the change of the voltage of the third node N3.

Because the second voltage signal VGL is at a low level, the second isolation transistor T20 is turned on, and the high-level trigger signal NGSTV is also transmitted to the second output control node PD, so that the second output transistor T18 is turned off. Because of the storage function of the second capacitor C2, the level of the first output control node PU may be kept at a low level, so that the first output transistor T17 is kept in a turned-on state, and the turned-on first output transistor T17 outputs the high-level first voltage signal VGH to the output terminal, so that the output signal OUT_1 output by the output terminal OUT_1 of the shift register unit 100-1 in the fifth working phase P5 is the high-level first voltage signal VGH.

In the sixth working phase P6, as shown in FIG. 4A, the first clock signal NCK changes from a low level to a high level, the trigger signal NGSTV is at a high level, the second clock signal NCB_O is at a low level, and the third clock signal NCB is at a high level.

Because the first clock signal NCK is at a high level, the input transistor T9 and the first control input transistor T11 are turned off. The second clock signal NCB_O is at a low level, so that the fourth control input transistor T13 and the first control output transistor T15 are turned off. The first control output transistor T15 is turned off, thereby preventing the voltage of the first output control node PU from fluctuating due to the change of the voltage of the third node N3. Because of the storage function of the first capacitor C1, the gate electrode of the bootstrap transistor T14 may continue to remain at a low level, so that the bootstrap transistor T14 is turned on, and the bootstrap transistor T14 may transmit the high-level third clock signal NCB to the third node N3, so that the voltage of the third node N3 may be kept at a high level.

Because of the storage function of the third capacitor C3, the level of the second output control node PD may be kept at a high level, so that the second output transistor T18 is turned off. Because of the storage function of the second capacitor C2, the level of the first output control node PU may be kept at a low level, so that the first output transistor T17 is kept in a turn-on state, and the turned-on first output transistor T17 outputs the high-level first voltage signal VGH to the output terminal, so that the output signal OUT_1 output by the output terminal OUT_1 of the shift register unit 100-1 in the sixth working phase P6 is the high-level first voltage signal VGH.

In the seventh working phase P7, as shown in FIG. 4A, the first clock signal NCK is at a high level, the trigger signal NGSTV changes from a high level to a low level, the second clock signal NCB_O changes from a low level to a high level, and the third clock signal NCB changes from a high level to a low level.

In the seventh working phase P7, for the states of respective transistors and nodes, reference may be made to the above description of the third working phase P3, and the repetition will not be repeated here. In the seventh working phase P7, the output signal OUT_1 output by the output terminal OUT_1 of the shift register unit 100-1 in the seventh working phase P7 is the high-level first voltage signal VGH.

In the eighth working phase P8, as shown in FIG. 4A, the first clock signal NCK is at a high level, the trigger signal NGSTV is at a low level, the second clock signal NCB_O changes from a high level to a low level, and the third clock signal NCB changes from a low level to a high level.

In the eighth working phase P8, for the states of respective transistors and nodes, reference may be made to the above description of the fourth working phase P4, and the repetition will not be repeated here. In the eighth working phase P8, the output signal OUT_1 output by the output terminal OUT_1 of the shift register unit 100-1 in the eighth working phase P8 is the high-level first voltage signal VGH.

It should be noted that, compared with the third working phase P3 and the fourth working phase P4, in the seventh working phase P7 and the eighth working phase P8, the trigger signal NGSTV is at a low level, but because the first clock signal NCK is at a high level in the third working phase P3, the fourth working phase P4, the seventh working phase P7, and the eighth working phase P8, the input transistor T9 is turned off, so that the trigger signal NGSTV will not be transmitted to the first node N1, and trigger signal NGSTV does not affect the states of respective transistors and nodes in the shift register unit.

In the ninth working phase P9, as shown in FIG. 4A, the first clock signal NCK changes from a high level to a low level, the trigger signal NGSTV is at a low level, the second clock signal NCB_O is at a low level, and the third clock signal NCB is at a high level.

The first clock signal NCK is at a low level, so the input transistor T9 and the first control input transistor T11 are turned on. The turned-on input transistor T9 transmits the low-level trigger signal NGSTV to the first node N1, so that the level of the first node N1 becomes low, and the second control input transistor T10 and the second control output transistor T16 are turned on. The turned-on second control output transistor T16 transmits the first voltage signal VGH to the first output control node PU, so that the voltage of the first output control node PU becomes a high level, and thus the first output transistor T17 is turned off.

For example, the turned-on first control input transistor T11 transmits the low-level second voltage signal VGL to the second node N2, so that the level of the second node N2 becomes low, so the third control input transistor T12 is turned on. In addition, because the second voltage signal VGL is at a low level, the first isolation transistor T19 is turned on, and the low-level second voltage signal VGL is also transmitted to the gate electrode of the bootstrap transistor T14, so that the bootstrap transistor T14 is turned on. Because the third clock signal NCB is at a high level, the bootstrap transistor T14 may transmit the high-level third clock signal NCB to the third node N3, so that the voltage of the third node N3 is at a high level. Because the second clock signal NCB_O is at a low level, the fourth control input transistor T13 and the first control output transistor T15 are turned off. Because the first control output transistor T15 is turned off, the third node N3 can be isolated from the first output control node PU, thus preventing the voltage of the third node N3 from affecting the first output control node PU.

In addition, because the second voltage signal VGL is at a low level, the second isolation transistor T20 is turned on, and the low-level trigger signal NGSTV is also transmitted to the second output control node PD, thereby causing the level of the second output control node PD to become a low level, so that the second output transistor T18 is turned on. The second voltage signal VGL is transmitted to the output terminal via the turned-on second output transistor T18, the output signal OUT_1 output by the output terminal OUT_1 of the shift register unit 100-1 in the ninth working phase P9 is the low-level second voltage signal VGL.

For example, the first control terminal of the second-stage shift register unit 100-2 is electrically connected to the third clock signal line NCB, the second control terminal of the second-stage shift register unit 100-2 is electrically connected to the fourth clock signal line NCK_O, and the third control terminal of the second-stage shift register unit 100-2 is electrically connected to the first clock signal line NCK. The output signal OUT_2 output by the output terminal OUT_2 of the second-stage shift register unit 100-2 is shown in FIG. 4A. For example, the data refresh phase further includes a tenth working phase P10 and an eleventh working phase P11. In the third working phase P3 and the fourth working phase P4, the output terminal OUT_2 of the second-stage shift register unit 100-2 outputs a low-level second voltage signal VGL (for detailed description, reference may be made to the working processes of the first-stage shift register unit in the above-mentioned first working phase P1 and the second working phase P2). During the fifth working phase P5 to the tenth working phase P10, the output terminal OUT_2 of the second-stage shift register unit 100-2 outputs the high-level first voltage signal VGH (for detailed description, reference may be made to the working processes of the first-stage shift register unit in the above-mentioned third working phase P3 to eighth working phase P8). In the eleventh working phase P11, the output terminal OUT_2 of the second-stage shift register unit 100-2 outputs the low-level second voltage signal VGL (for detailed description, reference may be made to the working process of the first-stage shift register unit in the ninth working phase P9 mentioned above). The analysis of the working process of the second-stage shift register unit 100-2 is similar to the above-mentioned analysis of the first-stage shift register unit 100-1, and the repetition will not be repeated here.

Figure 4B:
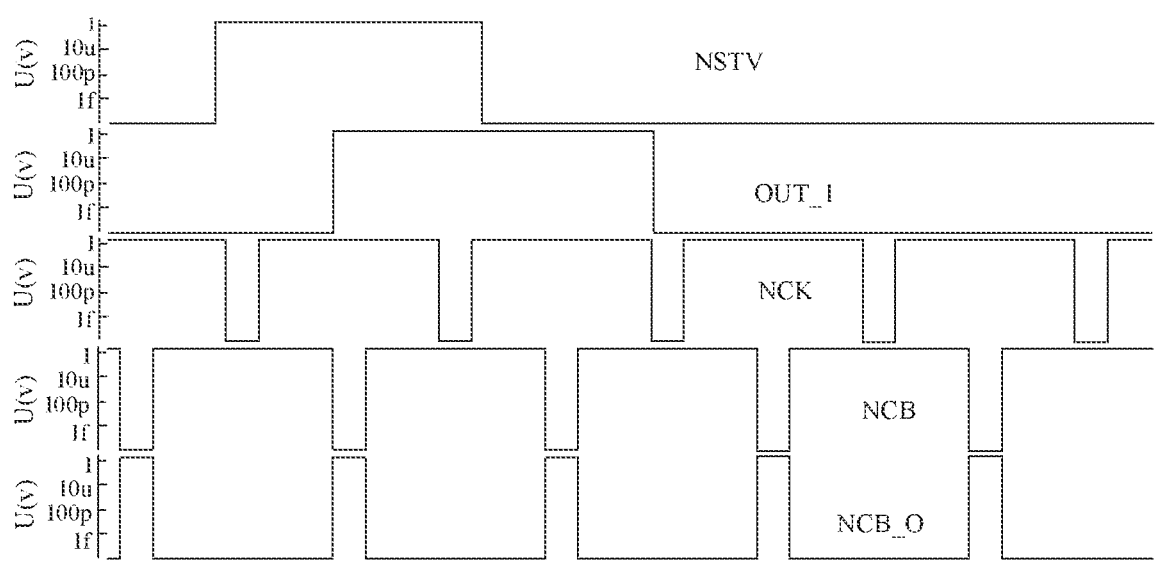
FIG. 4B is a simulation diagram of driving timing of a shift register unit provided by at least one embodiment of the present disclosure.

FIG. 4B is a simulation diagram of driving timing of a shift register unit provided by at least one embodiment of the present disclosure.

As shown in FIG. 4B, the ordinate represents the voltage U in volts (V), and the abscissa represents various signals, such as the trigger signal NGSTV, the first clock signal NCK, the second clock signal NCB_O, the third clock signal NCB, and the output signal OUT_1. The timing of this simulation diagram is consistent with the timing of the data refresh phase in the timing shown in FIG. 4A above.

For example, as shown in FIG. 4A, in a low-frequency driving mode, a time period of one frame in the working process of the shift register unit also includes a data holding phase. In the data holding phase, the first clock signal NCK and the third clock signal NCB are kept at a high level, and the second clock signal NCB_O and the fourth clock signal NCK_O are kept at a low level. At this time, the first output control node PU is kept at a high level and the second output control node PD is kept at a low level, so that the first output transistor T17 is turned off and the second output transistor T18 is turned on. Furthermore, the signal output from the output terminal OUT is the second voltage signal VL, thus achieving to output a signal at a low level, so that the refresh control transistor T8 in the pixel circuit 1120 may be controlled to be turned off, and the low-frequency driving mode can be achieved. Because the fourth control input transistor T13 and the first control output transistor T15 are oxide transistors, even if the first clock signal NCK, the second clock signal NCB_O, the third clock signal NCB, and the fourth clock signal NCK_O remain unchanged for a long time, the level of the first output control node PU and the level of the second output control node PD can be kept roughly stable, thus ensuring the stable output of the gate driving circuit and reducing the overall power consumption of the gate driving circuit.

It should be noted that the structure of the shift register unit in the light emitting control gate driving circuit and the structure of the shift register unit in the scanning control gate driving circuit can refer to the structure of the shift register unit 100 in the gate driving circuit 130 described in conjunction with FIG. 3, for example, in the light emitting control gate driving circuit and the scanning control gate driving circuit, the fourth control input transistor T13 and the first control output transistor T15 may be low-temperature polysilicon transistors, however, the present disclosure is not limited to this, and in the light emitting control gate driving circuit and the scanning control gate driving circuit, the fourth control input transistor T13 and the first control output transistor T15 may also be oxide transistors.

For example, according to the characteristics of transistors, transistors may be divided into N-type transistors and P-type transistors. For the sake of clarity, in the embodiments of the present disclosure, the technical solution of the present disclosure is described in detail by taking a case where transistors T1~T7, T9~T12, T14, and T16~T20 are all P-type transistors (for example, P-type MOS transistors), and the fourth control input transistor T13, the first control output transistor T15, and the refresh control transistor T8 are N-type transistors (for example, N-type MOS transistor) as an example, however, the embodiments of the present disclosure are not limited to this, and those skilled in the art can also make specific settings according to actual needs.

It should be noted that the transistors used in the embodiments of the present disclosure may be thin film transistors or field effect transistors or other switching devices with the same characteristics, and the thin film transistors may include oxide thin film transistors, amorphous silicon thin film transistors, or polysilicon thin film transistors (low-temperature polysilicon and high-temperature polysilicon), etc. The source electrode and the drain electrode of the transistor may be symmetrical in structure, so that the source electrode and the drain electrode of the transistor may have no difference in physical structure. In the embodiments of the present disclosure, in order to distinguish the two electrodes of the transistor except the gate electrode, one of the two electrodes is directly described as the first electrode, and the other of the two electrodes is directly described as the second electrode, and therefore, the first electrode and the second electrode of all or part of the transistors in the embodiments of the present disclosure may be interchanged as required. For example, for an N-type transistor, the first electrode of the transistor may be the source electrode and the second electrode may be the drain electrode; or, for a P-type transistor, the first electrode of the transistor is the drain electrode and the second electrode is the source electrode. When the transistor is a P-type transistor, the turn-on voltage is a low-level voltage (for example, 0V, −5V, or other values) and the turn-off voltage is a high-level voltage (for example, 5V, 10V, or other values); when the transistor is an N-type transistor, the turn-on voltage is a high-level voltage (for example, 5V, 10V, or other values) and the turn-off voltage is a low-level voltage (for example, 0V, −5V, or other values). Both the turn-on voltage and the turn-off voltage represent the voltage applied to the gate electrode of the transistor.

Figure 5A:
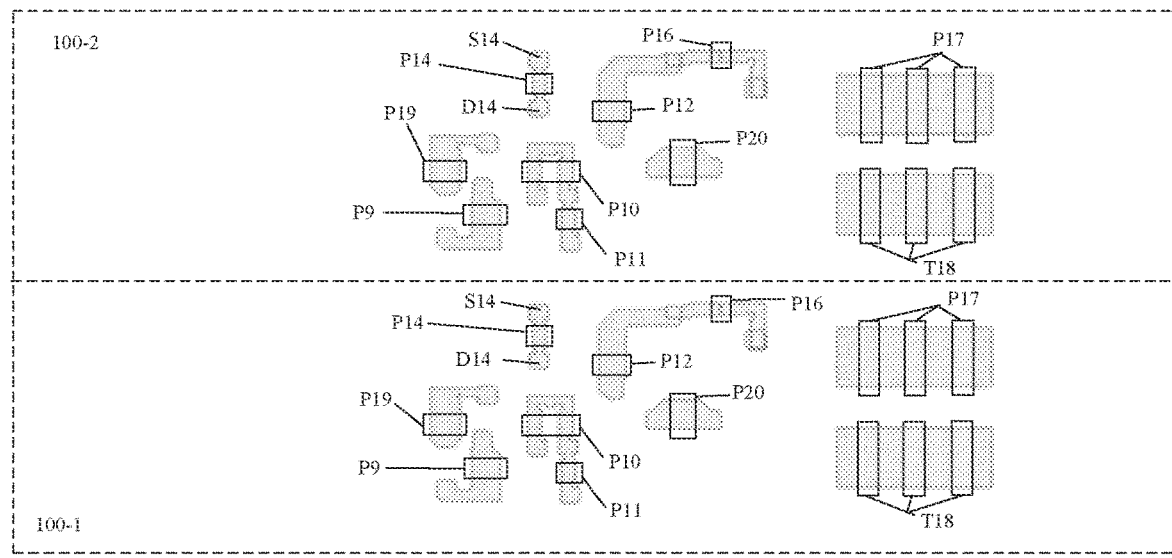
FIG. 5A~FIG. 5G are schematic diagrams of layouts of various layers of a gate driving circuit provided by some embodiments of the present disclosure.

FIGS. 5A~5G are schematic diagrams of layouts of various layers of a gate driving circuit provided by some embodiments of the present disclosure. The positional relationship of respective elements in the gate driving circuit 130 provided by the embodiment of the present disclosure on the backplane is described below with reference to FIG. 5A~FIG. 5G, and the example shown in FIG. 5A~FIG. 5G take the gate driving circuit including the shift register unit shown in FIG. 3 as an example. FIG. 5A to FIG. 5G show the first-stage shift register unit 100-1 and the second-stage shift register unit 100-2 in the gate driving circuit 130 provided by the embodiment of the present disclosure. The stacked structure of the rest shift register units of the gate driving circuit may refer to the stacked structure of the first-stage shift register unit 100-1 and the second-stage shift register unit 100-2 shown in FIG. 5A to FIG. 5G. It should be noted that the display substrate shown in FIG. 5A is illustrated by taking the layout design of two shift register units in the gate driving circuit and the signal lines connected to the two shift register units as an example. The layout implementation of the rest shift register units may refer to the layout shown in FIG. 5A, which will not be repeated here. Of course, other layout modes may also be adopted, and the embodiments of the present disclosure are not limited to this. Of course, all shift register units of each of other gate driving circuits (for example, the light emitting control gate driving circuit and the scanning control gate driving circuit) may also refer to the layout shown in FIG. 5A, and may also adopt other layouts. The embodiments of the present disclosure do not specifically limit the layout of the shift register unit.

For example, as shown in FIG. 5A~FIG. 5G, the display substrate 1 includes a semiconductor layer, a first insulating layer (not shown), a first metal layer, a second insulating layer (not shown), a second metal layer, a third insulating layer (not shown), an oxide layer, a fourth insulating layer (not shown), a third metal layer, a fifth insulating layer, and a fourth metal layer which are sequentially stacked on the base substrate 10.

For example, the semiconductor layer is located on the base substrate, the first insulating layer is located on the side of the semiconductor layer away from the base substrate, the first metal layer is located on the side of the first insulating layer away from the semiconductor layer, the second insulating layer is located on the side of the second insulating layer away from the first metal layer, the third insulating layer is located on the side of the second metal layer away from the second insulating layer, the oxide layer is located on the side of the third insulating layer away from the second metal layer, the fourth insulating layer is located on the side of the oxide layer away from the third insulating layer, the third metal layer is located on the side of the fourth insulating layer away from the oxide layer, the fifth insulating layer is located on the side of the third metal layer away from the fourth insulating layer, and the fourth metal layer is located on the side of the fifth insulating layer away from the third metal layer.

For example, the materials of the first insulating layer, the second insulating layer, the third insulating layer, the fourth insulating layer, and the fifth insulating layer may include inorganic insulating materials such as silicon nitride (SiNx), silicon oxide (SiOx), silicon oxynitride (SiNxOy), organic insulating materials such as organic resin, or other suitable materials, and the embodiments of the present disclosure are not limited to this.

Figure 5B:
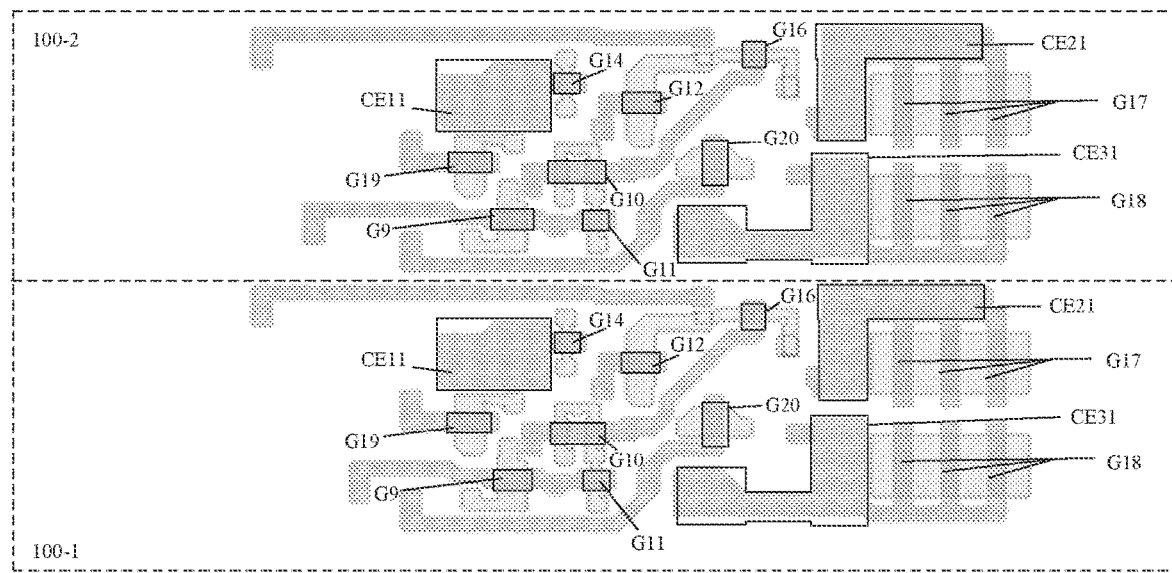
Figure 5C:
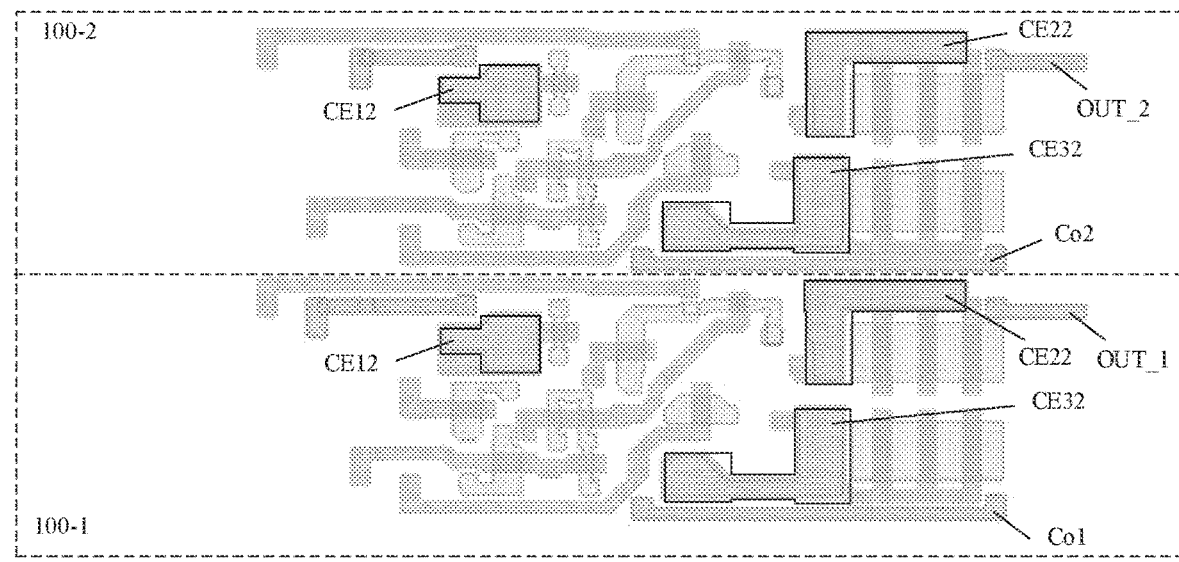
Figure 5D:
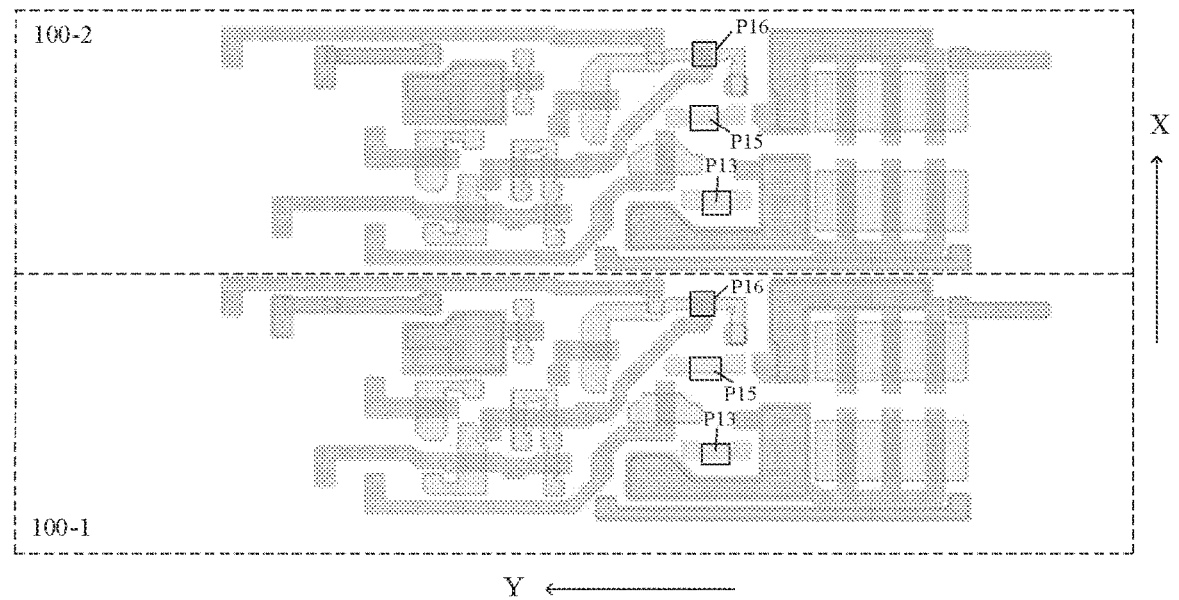
Figure 5E:
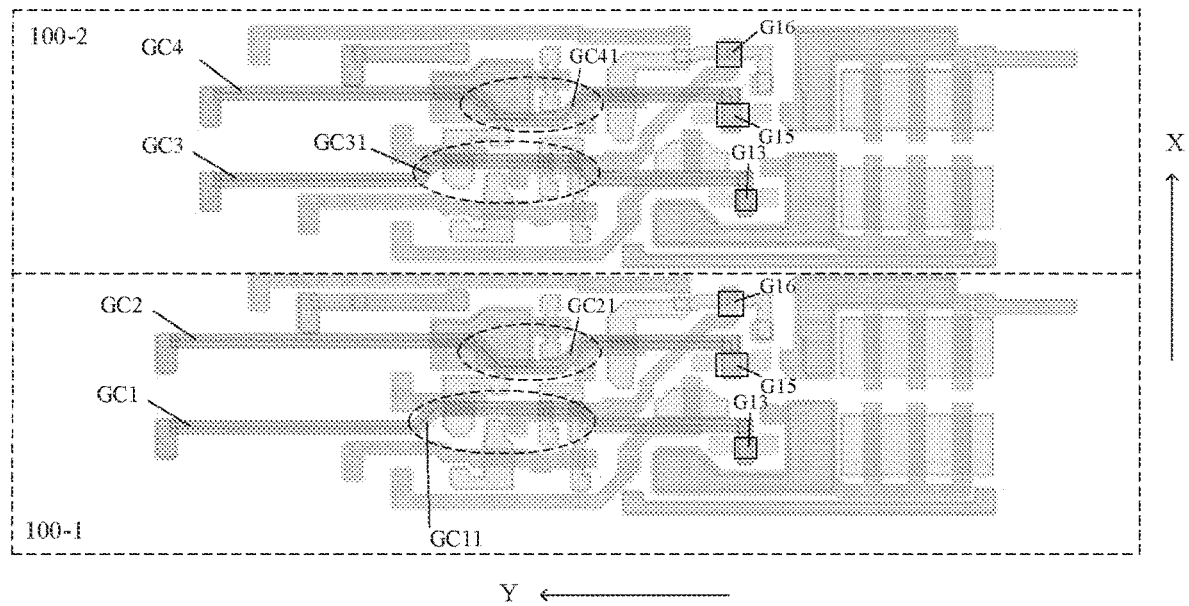
Figure 5F:
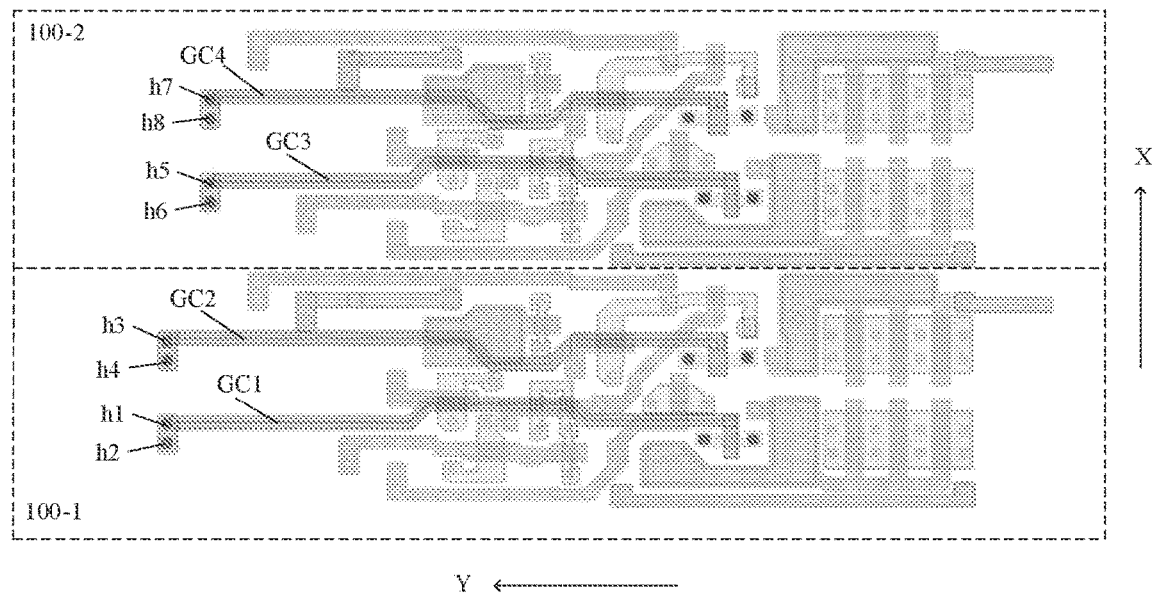
Figure 5G:
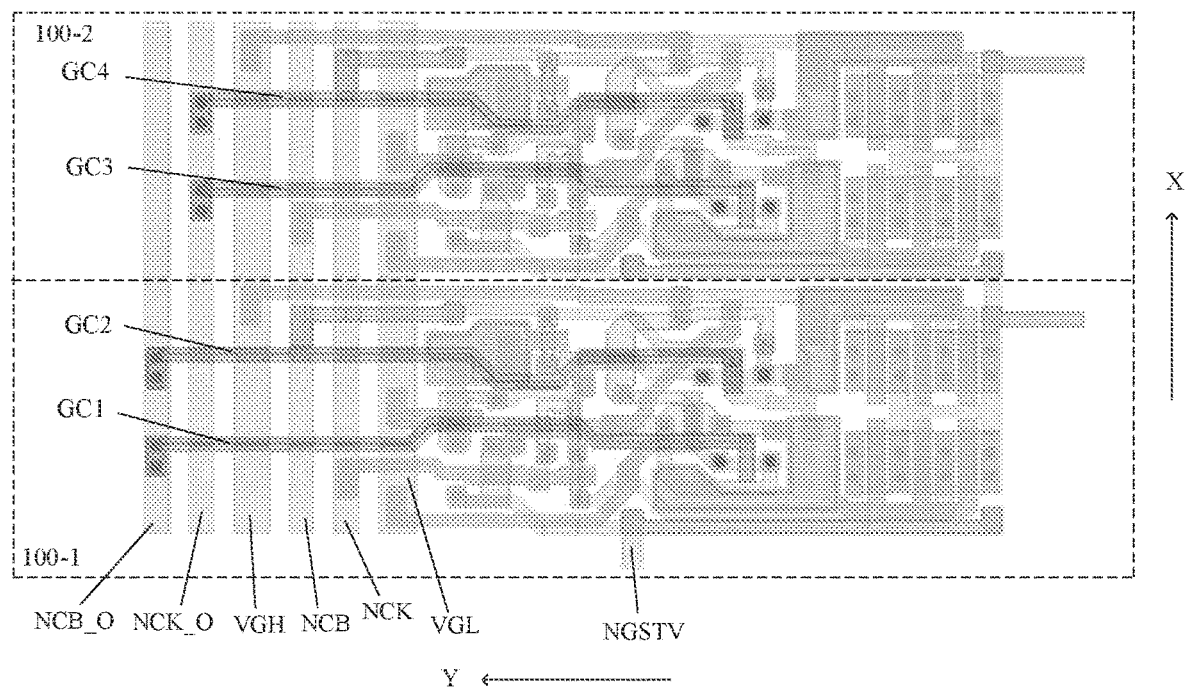

FIG. 5G is a schematic diagram of the stacking position relationship of the semiconductor layer, the first insulating layer (not shown), the first metal layer, the second insulating layer (not shown), the second metal layer, the third insulating layer (not shown), the oxide layer, the fourth insulating layer (not shown), the third metal layer, the fifth insulating layer, and the fourth metal layer.

For example, in FIG. 5A to FIG. 5G, the part indicated by each dotted rectangular box is the region corresponding to one shift register unit 100, and in FIG. 5A to FIG. 5G, two dotted rectangular boxes correspond to the first-stage shift register unit 100-1 and the second-stage shift register unit 100-2, respectively.

FIG. 5A is a diagram of a plan layout of a semiconductor layer provided by some embodiments of the present disclosure. For example, FIG. 5A shows the semiconductor layer of the display substrate. The semiconductor layer may be patterned on the base substrate by using semiconductor materials, and the semiconductor layer may have a short-bar shape or a curved or bent shape as required. The semiconductor layer may be used to manufacture the active layers of some transistors (transistors T9~T12, T14, and T16~T20) in the shift register unit. Each active layer may include a source region, a drain region, and a channel region between the source region and the drain region. The channel region is used to form the channel of the transistor. For example, the channel region may be doped with impurities, thus having semiconductor characteristics; the source region and the drain region are on both sides of the channel region, and may be doped with impurities, and thus having conductivity.

For example, as shown in FIG. 5A, the shape of the pattern in the region, corresponding to the first-stage shift register unit 100-1, of the semiconductor layer and the shape of the pattern in the region, corresponding to the second-stage shift register unit 100-2, of the semiconductor layer may be the same.

For example, as shown in FIG. 5A, taking the bootstrap transistor T14 as an example, the active layer of the bootstrap transistor T14 includes a source region S14, a drain region D14, and a channel region P14. For example, the parts shown in the rectangular boxes P9~P12, P14, and P16~P20 shown in FIG. 5A are the channel regions of the active layers of transistors T9~T12, T14, and T16~T20, respectively, that is, the part shown in the rectangular box P9 is the channel region of the active layer of the input transistor T9, the part shown in the rectangular box P10 is the channel region of the active layer of the second control input transistor T10, and so on, the part shown in the rectangular box P20 is the channel region of the active layer of the second isolation transistor T20.

For example, as shown in FIG. 5A, in each shift register unit, the active layer of the third control input transistor T12 and the active layer of the second control output transistor T16 are integrally provided, and the active layer of the second control input transistor T10 and the active layer of the first control input transistor T11 are integrally provided. For example, the channel region P10 of the active layer of the second control input transistor T10 includes two separate parts.

For example, the material of the semiconductor layer may include oxide semiconductor, organic semiconductor, amorphous silicon, polysilicon, etc. For example, the oxide semiconductor includes metal oxide semiconductor (such as indium gallium zinc oxide (IGZO)), and the polysilicon includes low-temperature polysilicon or high-temperature polysilicon, etc., and the embodiments of the present disclosure are not limited to this. It should be noted that the above-mentioned source region and drain region may be regions doped with N-type impurities or P-type impurities, and the embodiments of the present disclosure do not limit this. For example, in the embodiments of the present disclosure, the doped source region corresponds to the source electrode of the transistor (e.g., the first electrode of the transistor), and the doped drain region corresponds to the drain electrode of the transistor (e.g., the second electrode of the transistor).

FIG. 5B is a diagram of a plan layout formed by stacking a semiconductor layer and a first metal layer shown in FIG. 5A.

For example, a first insulating layer (not shown) is formed on the above-mentioned semiconductor layer to protect the above-mentioned semiconductor layer. FIG. 5B shows a first metal layer, the first metal layer is arranged on the side of the first insulating layer away from the semiconductor layer, so as to be insulated from the semiconductor layer. In FIG. 5B, the parts other than the semiconductor layer shown in FIG. 5A are the first metal layer.

For example, as shown in FIG. 5B, the first metal layer may include the first electrode CE11 of the first capacitor C1, the first electrode CE12 of the second capacitor C2, and the first electrode CE13 of the third capacitor C3, and the gate electrodes G9-G12, G14, and G16-G20 of the respective transistors T9~T12, T14, and T16~T20. As shown in FIG. 5B, the gate electrodes G9-G12, G14, and G16-G20 of the respective transistors T9~T12, T14, and T16~T20 are the respective parts of the first metal layer that overlap with the semiconductor layer.

For example, as shown in FIG. 5B, the shape of the pattern in the region, corresponding to the first-stage shift register unit 100-1, of the first metal layer is approximately the same as the pattern in the region, corresponding to the second-stage shift register unit 100-2, of the first metal layer.

For example, as shown in FIG. 5B, in each shift register unit, the gate electrode G17 of the first output transistor T17 has a comb structure, and the gate electrode G18 of the second output transistor T18 also has a comb structure.

For example, as shown in FIG. 5B, in each shift register unit, the gate electrode G14 of the bootstrap transistor T14 is provided integrally (integrated) with the first electrode CE11 of the first capacitor C1, the gate electrode G10 of the second control input transistor T10 is provided integrally with the gate electrode G16 of the second control output transistor T16, the gate electrode G9 of the input transistor T9 and the gate electrode G11 of the first control input transistor T11 are provided integrally, the gate electrode G17 of the first output transistor T17 is provided integrally with the first electrode CE21 of the second capacitor C2, and the gate electrode G18 of the second output transistor T18 is provided integrally with the first electrode CE31 of the third capacitor C3.

It should be noted that rectangular boxes P9-P12, P14, and P16-P20 in FIG. 5A show the parts of the semiconductor layer overlapping with the first metal layer, that is, the parts of the semiconductor layer overlapping with the first metal layer are the channel regions of the transistors T9~T12, T14, and T16~T20. The rectangular boxes G9~G12, G14, and G16~G20 in FIG. 5B show the parts of the first metal layer overlapping with the semiconductor layer, that is, the parts of the first metal layer overlapping with the semiconductor layer are the gate electrodes of the transistors T9~T12, T14, and T16~T20.

FIG. 5C is a diagram of a plan layout formed by stacking a semiconductor layer, a first metal layer, and a second metal layer. The stacked structure shown in FIG. 5C is obtained by providing a second metal layer on the stacked structure shown in FIG. 5B.

For example, a second insulating layer (not shown) is formed on the first metal layer to protect the above-mentioned first metal layer. FIG. 5C shows a second metal layer, the second metal layer is arranged on the side of the second insulating layer away from the first metal layer, so as to be insulated from the first metal layer. In FIG. 5C, the parts other than the semiconductor layer and the first metal layer shown in FIG. 5B are the second metal layer.

For example, as shown in FIG. 5C, the second metal layer includes the second electrode CE21 of the first capacitor C1, the second electrode CE22 of the second capacitor C2, and the second electrode CE23 of the third capacitor C3. For example, the second electrode CE21 at least partially overlaps with the first electrode CE11 to form the first capacitor C1, the second electrode CE22 at least partially overlaps with the first electrode CE12 to form the second capacitor C2, and the second electrode CE23 at least partially overlaps with the first electrode CE13 to form the third capacitor C3.

For example, as shown in FIG. 5C, the second metal layer further includes the output terminal OUT_1 of the first-stage shift register unit 100-1 and the output terminal OUT_2 of the second-stage shift register unit 100-2.

For example, as shown in FIG. 5C, the shape of the pattern in the region, corresponding to the first-stage shift register unit 100-1, of the second metal layer is approximately the same as the shape of the pattern in the region, corresponding to the second-stage shift register unit 100-2, of the second metal layer.

For example, as shown in FIG. 5C, in the region corresponding to the first-stage shift register unit 100-1, the second metal layer further includes a connection line Co1, the connection line Co1 is connected to the trigger terminal of the first-stage shift register unit 100-1, and in the region corresponding to the second-stage shift register unit 100-2, the second metal layer further includes a connection line Co2, the connection line Co2 is connected to the trigger terminal of the second-stage shift register unit 100-2. For example, the shape of the connection line Co1 and the shape of the connection line Co2 may be the same.

FIG. 5D is a diagram of a plan layout formed by stacking a semiconductor layer, a first metal layer, a second metal layer, and an oxide layer. The stacked structure shown in FIG. 5D is obtained by providing an oxide layer on the stacked structure shown in FIG. 5C.

For example, a third insulating layer (not shown) is formed on the above-mentioned second metal layer to protect the above-mentioned second metal layer. FIG. 5D shows an oxide layer, the oxide layer is arranged on the side of the third insulating layer away from the second metal layer so as to be insulated from the second metal layer. In FIG. 5D, the parts other than the semiconductor layer, the first metal layer, and the second metal layer shown in FIG. 5C are the oxide layer.

For example, the oxide layer may be patterned and formed on the third insulating layer of the base substrate 10 using an oxide semiconductor material, and the oxide layer may have a short-bar shape or a curved or bent shape as required. The oxide layer may be used to manufacture active layers of some transistors (the fourth control input transistor T13 and the first control output transistor T15) in the shift register unit. For example, the parts shown in the rectangular boxes P13 and P15 shown in FIG. 5D are the channel regions of the active layers of the fourth control input transistor T13 and the first control output transistor T15, respectively, that is, the part shown in the rectangular box P13 is the channel region of the active layer of the fourth control input transistor T13.

For example, as shown in FIG. 5D, the shape of the oxide semiconductor material in the region, corresponding to the first-stage shift register unit 100-1, of the oxide layer is the same as the shape of the oxide semiconductor material in the region, corresponding to the second-stage shift register unit 100-2, of the oxide layer.

For example, as shown in FIG. 5D, the active layer of the fourth control input transistor T13 extends substantially in the second direction Y, and the active layer of the first control output transistor T15 extends substantially in the second direction Y.

For example, the orthographic projection of the channel region P13 of the active layer of the fourth control input transistor T13 in the first direction X partially overlaps with the orthographic projection of the channel region P15 of the active layer of the first control output transistor T15 in the first direction X.

For example, the first direction X and the second direction Y are perpendicular to each other.

For example, the material of the oxide layer may include an oxide semiconductor and the like, for example, the oxide semiconductor includes a metal oxide semiconductor (such as indium gallium zinc oxide (IGZO)), and the embodiments of the present disclosure are not limited to this.

For example, each shift register unit includes at least one first transistor, and at least one first transistor in the n-th stage shift register unit is electrically connected with the second clock signal line, so as to be turned on or off under the control of the second clock signal. At least one first transistor in the (n+1)-th stage shift register unit is electrically connected with the fourth clock signal line, so as to be turned on or off under the control of the fourth clock signal.

For example, the at least one first transistor may be an oxide transistor, and for example, the at least one first transistor may be the fourth control input transistor T13 and the first control output transistor T15 shown in FIG. 3.

For example, each shift register unit further includes a plurality of second transistors, and the type of the at least one active layer of the at least one first transistor is different from the types of the active layers of the plurality of second transistors. It should be noted that in the present disclosure, "the type of the active layer of the first transistor is different from the type of the active layer of the second transistor" means that the material of the active layer of the first transistor is different from the material of the active layer of the second transistor.

For example, the plurality of second transistors are poly-silicon transistors. For example, the plurality of second transistors may be transistors T9~T12, T14, and T16~T20 shown in FIG. 3.

For example, the type of the at least one active layer of the at least one first transistor may be the same, that is, the at least one active layer of the at least one first transistor is made of the same material. For example, the types of the active layers of the second transistors may be the same, that is, the active layers of the second transistors are made of the same material. In some embodiments, the active layer of the at least one first transistor is made of indium gallium zinc oxide, and the active layers of the plurality of second transistors are all made of low-temperature polysilicon.

For example, in each shift register unit, the at least one active layer of the at least one first transistor is located in the same layer, the active layers of the plurality of second transistors are located in the same layer, and the layer where the at least one active layer of the at least one first transistor is located is different from the layer where the active layers of the plurality of second transistors are located. For example, in some embodiments, the at least one first transistor is the fourth control input transistor T13 and the first control output transistor T15 shown in FIG. 3, and the plurality of second transistors may be transistors T9~T12, T14, and T16~T20 shown in FIG. 3. In this case, the at least one active layer of the at least one first transistor is located in the oxide layer shown in FIG. 5D, and the active layers of the plurality of second transistors are located in the semiconductor layer shown in FIG. 5A.

For example, the active layers of the first transistors of all shift register units in the gate driving circuit are in the same layer, and the active layers of the second transistors of all shift register units in the gate driving circuit are in the same layer.

For example, the orthographic projection of the at least one active layer of the at least one first transistor on the base substrate does not overlap with the orthographic projection of the active layers of the plurality of second transistors on the base substrate. As shown in FIG. 5D, the orthographic projections of the active layers of the fourth control input transistor T13 and the first control output transistor T15 on the base substrate do not overlap with the orthographic projections of the active layers of the transistors T9~T12, T14, and T16~T20 on the base substrate.

For example, as shown in FIG. 5D, the orthographic projection of the channel region P16 of the active layer of the second control output transistor T16 in the first direction X at least partially overlaps with the orthographic projection of the channel region P15 of the active layer of the first control output transistor T15 in the first direction X.

FIG. 5E is a diagram of a plan layout formed by stacking a semiconductor layer, a first metal layer, a second metal layer, an oxide layer, and a third metal layer. The stacked structure shown in FIG. 5E is obtained by providing a third metal layer on the stacked structure shown in FIG. 5D.

For example, a fourth insulating layer (not shown) is formed on the above-mentioned oxide layer to protect the above-mentioned oxide layer. FIG. 5E shows a third metal layer, the third metal layer is arranged on the side of the fourth insulating layer away from the oxide layer, so as to be insulated from the oxide layer. In FIG. 5E, the parts other than the semiconductor layer, the first metal layer, the second metal layer, and the oxide layer shown in FIG. 5D are the third metal layer.

For example, as shown in FIG. 5E, the third metal layer may include the gate electrode G13 of the fourth control input transistor T13 and the gate electrode G15 of the first control output transistor T15. As shown in FIG. 5E, the gate electrode G13 of the fourth control input transistor T13 and the gate electrode G15 of the first control output transistor T15 are parts of the third metal layer that overlap with the oxide layer.

For example, as shown in FIG. 5E, the shape of the pattern in the region, corresponding to the first-stage shift register unit 100-1, of the third metal layer is approximately the same as the shape of the pattern in the region, corresponding to the second-stage shift register unit 100-2, of the third metal layer.

It should be noted that rectangular boxes P13 and P15 in FIG. 5D show the parts of the oxide layer that overlap with the third metal layer. The parts of the oxide layer overlapping with the third metal layer are the channel regions of the fourth control input transistor T13 and the first control output transistor T15. Rectangular boxes G13 and G15 in FIG. 5E show the parts of the third metal layer overlapping with the oxide layer, that is, the parts of the third metal layer overlapping with the oxide layer are the gate electrode of the fourth control input transistor T13 and the gate electrode of the first control output transistor T15.

For example, in each shift register unit, the at least one gate electrode of the at least one first transistor is located in the same layer, the gate electrodes of the plurality of second transistors are located in the same layer, and the layer where the at least one gate electrode of the at least one first transistor is located is different from the layer where the gate electrodes of the plurality of second transistors are located. For example, in some embodiments, the at least one first transistor is the fourth control input transistor T13 and the first control output transistor T15 shown in FIG. 3, and the plurality of second transistors may be transistors T9~T12, T14, and T16~T20 shown in FIG. 3. In this case, the at least one gate electrode of the at least one first transistor is located in the third metal layer shown in FIG. 5E, and the gate electrodes of the plurality of second transistors are located in the first metal layer shown in FIG. 5B.

For example, the gate electrodes of the first transistors of all shift register units in the gate driving circuit are located in the same layer, and the gate electrodes of the second transistors of all shift register units in the gate driving circuit are located in the same layer.

For example, as shown in FIG. 5E, on the base substrate, the orthographic projection of the gate electrode G16 of the second control output transistor T16 in the first direction X at least partially overlaps with the orthographic projection of the gate electrode G15 of the first control output transistor T15 in the first direction X.

FIG. 5F is a diagram of a plan layout formed by stacking a semiconductor layer, a first metal layer, a second metal layer, an oxide layer, a third metal layer, and a fifth insulating layer. The stacked structure shown in FIG. 5F is obtained by providing a fifth insulating layer on the stacked structure shown in FIG. 5E.

For example, a fifth insulating layer is formed on the above-mentioned third metal layer to protect the above-mentioned third metal layer. FIG. 5F shows a fifth insulating layer. A plurality of holes may be formed in the fifth insulating layer for achieving electrical connection. The hole may penetrate through one insulating layer or a plurality of insulating layers, and the specific situation is determined according to the position of the hole.

For example, for each shift register unit, the display substrate 1 further includes at least one gate connection line in one-to-one correspondence with the at least one first transistor and a plurality of holes. The at least one gate connection line may be disposed in the third metal layer, and the plurality of holes include at least one first hole corresponding to each gate connection line in the n-th stage shift register unit and at least one second hole corresponding to each gate connection line in the (n+1)-th stage shift register unit.

For example, the gate electrode of each first transistor in the n-th stage shift register unit is electrically connected to the gate connection line corresponding to each first transistor in the n-th stage shift register unit, the gate connection line corresponding to each first transistor in the n-th stage shift register unit extends to the second clock signal line approximately along the second direction and is electrically connected to the second clock signal line through the at least one first hole. For example, the gate electrode of each first transistor in the (n+1)-th stage shift register unit is electrically connected to the gate connection line corresponding to each first transistor in the (n+1)-th stage shift register unit, the gate connection line corresponding to each first transistor in the (n+1)-th stage shift register unit extends to the fourth clock signal line along the second direction and is electrically connected to the fourth clock signal line through the at least one second hole.

For example, when the at least one first transistor is the fourth control input transistor T13 and the first control output transistor T15 shown in FIG. 3, as shown in FIG. 5E to FIG. 5F, in the region corresponding to the first-stage shift register unit 100-1, the third metal layer includes a gate connection line GC1 and a gate connection line GC2, the gate connection line GC1 corresponds to the fourth control input transistor T13 of the first-stage shift register unit 100-1, the gate connection line GC2 corresponds to the first control output transistor T15 of the first-stage shift register unit 100-1. The gate electrode of the fourth control input transistor T13 of the first-stage shift register unit 100-1 is electrically connected to the gate connection line GC1, and the gate electrode of the first control output transistor T15 of the first-stage shift register unit 100-1 is electrically connected to the gate connection line GC2. Similarly, as shown in FIG. 5E to FIG. 5F, in the region corresponding to the second-stage shift register unit 100-2, the third metal layer includes a gate connection line GC3 and a gate connection line GC4. The gate connection line GC3 corresponds to the fourth control input transistor T13 of the second-stage shift register unit 100-2, and the gate connection line GC4 corresponds to the first control output transistor T15 of the second-stage shift register unit 100-2. The gate electrode of the fourth control input transistor T13 of the second-stage shift register unit 100-2 is electrically connected to the gate connection line GC3, and the gate electrode of the first control output transistor T15 of the second-stage shift register unit 100-2 is electrically connected to the gate connection line GC4.

For example, the gate electrode of each first transistor is integrally provided with the gate connection line corresponding to each first transistor. As shown in FIG. 5E, the gate electrode of the fourth control input transistor T13 of the first-stage shift register unit 100-1 is integrally provided with the gate connection line GC1, the gate electrode of the first control output transistor T15 of the first-stage shift register unit 100-1 is integrally provided with the gate connection line GC2, the gate electrode of the fourth control input transistor T13 of the second-stage shift register unit 100-2 is integrally provided with the gate connection line GC3, and the gate electrode of the first control output transistor T15 of the second-stage shift register unit 100-2 is integrally provided with the gate connection line GC4.

For example, as shown in FIG. 5E and FIG. 5F, the shape of the gate connection line GC1 is similar to that of the gate connection line GC3, and the shape of the gate connection line GC2 is similar to that of the gate connection line GC4.

For example, as shown in FIG. 5F, the plurality of holes include the hole h1 to the hole h8, and the hole h1 to the hole h8 only penetrate through the fifth insulating layer, thereby exposing part of the metal in the third metal layer. For example, the hole h1 and the hole h2 penetrate the fifth insulating layer and expose the part of the gate connection line GC1, the hole h3 and the hole h4 penetrate the fifth insulating layer and expose the part of the gate connection line GC2, the hole h5 and the hole h6 penetrate the fifth insulating layer and expose the part of the gate connection line GC3, and the hole h7 and the hole h8 penetrate the fifth insulating layer and expose the part of the gate connection line GC4.

For example, in some examples, the first-stage shift register unit is an example of the n-th stage shift register unit, and the second-stage shift register unit is an example of the (n+1)-th stage shift register unit. In this case, the hole h1 to the hole h4 are the first holes, and the hole h5 to the hole h8 are the second holes.

FIG. 5G is a diagram of a plan layout formed by stacking a semiconductor layer, a first metal layer, a second metal layer, an oxide layer, a third metal layer, a fifth insulating layer, and a fourth metal layer. The stacked structure shown in FIG. 5G is obtained by providing a fourth metal layer on the stacked structure shown in FIG. 5F.

FIG. 5G shows a fourth metal layer, the fourth metal layer is arranged on the side of the fifth insulating layer away from the third metal layer, so as to be insulated from the third metal layer. In FIG. 5G, the parts other than the semiconductor layer, the first metal layer, the second metal layer, the oxide layer, the third metal layer, and the fifth insulating layer shown in FIG. 5F are the fourth metal layer.

For example, as shown in FIG. 5G, the fourth metal layer includes a plurality of clock signal lines (for example, the first clock signal line NCK, the second clock signal line NCB_O, the third clock signal line NCB, and the fourth clock signal line NCK_O), the first voltage line VGH, the second voltage line VGL, the trigger signal line NGSTV, and the first electrodes and the second electrodes of the respective transistors (T9~T20), and the like. It should be noted that the fourth metal layer also includes connection lines for connecting transistors, capacitors, and signal lines. As shown in FIG. 5G, the first clock signal line NCK, the second clock signal line NCB_O, the third clock signal line NCB, the fourth clock signal line NCK_O, the first voltage line VGH, the second voltage line VGL, and the trigger signal line NGSTV are connected to the transistors/capacitors and the like that need to be connected therewith in other layers through the various holes and/or the connection lines, and the first electrodes and the second electrodes of the respective transistors are also connected to structures (e.g., source regions and/or drain regions, etc.) that need to be connected therewith in other layers through the holes and/or the connection lines, which will not be described here.

For example, the material of the first metal layer, the material of the second metal layer, the material of the third metal layer, and the material of the fourth metal layer may be the same, for example, may include aluminum, aluminum alloy, copper, copper alloy, indium tin oxide, or any other suitable material, and the embodiments of the present disclosure are not limited to this.

It should be noted that, in other examples, the first electrode and the second electrode of each transistor may also be located in other conductive layer, and connected with the corresponding active layer of the transistor through holes located in the insulating layer between the conductive layer where the first electrode and the second electrode of the transistor is located and the semiconductor layer or the oxide layer. The embodiments of the present disclosure are not limited to this.

For example, the trigger terminal of the first-stage shift register unit 100-1 among the plurality of shift register units is electrically connected with the trigger signal line NGSTV to receive the signal provided by the trigger signal line NGSTV as the trigger signal of the first-stage shift register unit 100-1. In addition to the first-stage shift register unit 100-1, the trigger terminal of the current-stage shift register unit among the plurality of shift register units is connected to the output terminal of the previous-stage shift register unit adjacent to the current-stage shift register unit, so as to receive the output signal output by the output terminal of the previous-stage shift register unit as the trigger signal of the current-stage shift register unit, thereby achieving the cascade arrangement of the plurality of shift register units. For example, as shown in FIG. 5C and FIG. 5G, the connection line Co1 may be connected with the trigger signal line NGSTV, that is, the connection line Co1 is used to connect the trigger terminal of the first-stage shift register unit 100-1 with the trigger signal line NGSTV; the connection line Co2 may be electrically connected with the output terminal OUT_1 of the first-stage shift register unit 100-1 to achieve cascade connection, that is, the connection line Co2 is used to connect the trigger terminal of the second-stage shift register unit 100-2 with the output terminal OUT_1 of the first-stage shift register unit 100-1.

For example, as shown in FIG. 5G, on the base substrate, the first clock signal line NCK, the second clock signal line NCB_O, the third clock signal line NCB, and the fourth clock signal line NCK_O all extend along the first direction X and are arranged along the second direction Y different from the first direction X.

For example, as shown in FIG. 5G, in the second direction Y, the first clock signal line NCK, the third clock signal line NCB, the fourth clock signal line NCK_O, and the second clock signal line NCB_O are sequentially arranged. That is, in the second direction Y, the third clock signal line NCB is located between the first clock signal line NCK and the fourth clock signal line NCK_O, and the fourth clock signal line NCK_O is located between the third clock signal line NCB and the second clock signal line NCB_O.

For example, as shown in FIG. 5G, on the base substrate, the first voltage line VGH and the second voltage line VGL extend along the first direction X and are arranged in the second direction Y.

For example, as shown in FIG. 5G, in the second direction Y, the first voltage line VGH is located between the third clock signal line NCB and the second clock signal line NCB_O, and the first clock signal line NCK are located between the first voltage line VGH and the second voltage line VGL. That is, in the second direction Y, the second voltage line VGL, the first clock signal line NCK, the third clock signal line NCB, the first voltage line VGH, the fourth clock signal line NCK_O, and the second clock signal line NCB_O are arranged in sequence.

For example, the second voltage line VGL, the first clock signal line NCK, the third clock signal line NCB, the first voltage line VGH, the fourth clock signal line NCK_O, and the second clock signal line NCB_O are disposed on the same side of the display substrate 1, for example, on the left side in the example shown in FIG. 5G.

For example, as shown in FIG. 5G, the gate connection line GC1 extends to the second clock signal line NCB_O along the second direction Y and is electrically connected to the second clock signal line NCB_O through at least one first hole (for example, in the examples shown in FIG. 5F and FIG. 5G, through two first holes h1 and h2, and the two first holes h1 and h2 are arranged along the first direction X), the gate connection line GC2 extends to the second clock signal line NCB_O along the second direction Y and is electrically connected to the second clock signal line NCB_O through at least one first hole (for example, in the example shown in FIG. 5F and FIG. 5G, through two first holes h3 and h4, and the two first holes h3 and h4 are arranged along the first direction X), and therefore, the gate electrode of the first control output transistor T15 and the gate electrode of the fourth control input transistor T13 of the first-stage shift register unit 100-1 are both electrically connected to the second clock signal line NCB_O.

For example, as shown in FIG. 5G, the gate connection line GC3 extends to the fourth clock signal line NCK_O along the second direction Y and is electrically connected to the fourth clock signal line NCK_O through at least one second hole (for example, in the examples shown in FIG. 5F and FIG. 5G, through two second holes h5 and h6, and the two second holes h5 and h6 are arranged along the first direction X), the gate connection line GC4 extends to the fourth clock signal line NCK_O along the second direction Y and is electrically connected to the fourth clock signal line NCK_O through at least one second hole (for example, in the example shown in FIG. 5F and FIG. 5G, through two second holes h7 and h8, and the two second holes h7 and h8 are arranged along the first direction X), and therefore, the gate electrode of the first control output transistor T15 and the gate electrode of the fourth control input transistor T13 of the second-stage shift register unit 100-2 are both electrically connected to the fourth clock signal line NCK_O.

In other embodiments of the present disclosure, only one first hole/second hole may be correspondingly provided for each gate connection line. Alternatively, a plurality of (e.g., three, four, etc.) first holes/second holes may be correspondingly arranged for each gate connection line, and the plurality of first holes/second holes may be arranged along the first direction X, the second direction Y, or other directions according to different actual layout requirements, which is not limited by the embodiments of the present disclosure.

For example, the orthographic projection of each gate connection line in the n-th stage shift register unit on the base substrate does not overlap with the orthographic projection of holes other than the first hole among the plurality of holes on the base substrate. The orthographic projection of each gate connection line in the (n+1)-th stage shift register unit on the base substrate does not overlap with the orthographic projection of the holes other than the second hole among the plurality of holes on the base substrate. As shown in FIG. 5F, except for the first hole, the orthographic projection of the gate connection line GC1 and the orthographic projection of the gate connection line GC2 on the base substrate do not overlap with the orthographic projection of any hole on the base substrate, the orthographic projection of the gate connection line GC1 on the base substrate only overlaps with the orthographic projection of the first holes h1 and h2 on the base substrate, and the orthographic projection of the gate connection line GC2 on the base substrate only overlaps with the orthographic projection of the first holes h3 and h4 on the base substrate. Except for the second hole, the orthographic projection of the gate connection line GC3 and the orthographic projection of the gate connection line GC4 on the base substrate do not overlap with the orthographic projection of any hole on the base substrate, the orthographic projection of the gate connection line GC3 on the base substrate only overlaps with the orthographic projection of the second holes h5 and h6 on the base substrate, and the orthographic projection of the gate connection line GC4 on the base substrate only overlaps with the orthographic projection of the second holes h7 and h8 on the base substrate.

For example, each gate connection line includes a straight part and a protruding part, and in the case where at least one gate connection line includes two gate connection lines, the protruding direction of the protruding portion of one gate connection line of the two gate connection lines and the protruding direction of the protruding portion of the other gate connection line of the two gate connection lines are opposite to each other. As shown in FIG. 5E, the gate connection line GC1 includes a straight part and a protruding part GC11, the gate connection line GC2 includes a straight part and a protruding part GC21, the part of the gate connection line GC1 except the protruding part GC11 is the straight part of the gate connection line GC1, and the part of the gate connection line GC2 except the protruding part GC21 is the straight part of the gate connection line GC2. The protruding direction of the protruding part GC11 and the protruding direction of the protruding part GC21 are opposite to each other. For example, in FIG. 5E, the protruding part GC21 protrudes downward and the protruding part GC11 protrudes upward. The straight part of the gate connection line GC1 and the straight part of the gate connection line GC2 both extend in the second direction Y. Similarly, the gate connection line GC3 includes a straight part and a protruding part GC31, and the gate connection line GC4 includes a straight part and a protruding part GC41, and the protruding direction of the protruding part GC31 and the protruding direction of the protruding part GC41 are opposite to each other.

It should be noted that the setting positions and the shapes of the gate connection lines are not limited to those shown in FIG. 5E, as long as the gate connection lines do not affect the connection of other elements in the display substrate.

For example, each pixel circuit includes at least one third transistor, and the type of the at least one first transistor in the shift register unit is the same as that of the at least one third transistor in the pixel circuit, for example, the at least one third transistor is an oxide transistor. For example, in some embodiments, the at least one third transistor may be the refresh control transistor T8 in the pixel circuit shown in FIG. 2A.

For example, the at least one active layer of the at least one first transistor and the at least one active layer of the at least one third transistor are located in the same layer, for example, in the oxide layer, and the at least one gate electrode of the at least one first transistor and the at least one gate electrode of the at least one third transistor are located in the same layer, for example, in the fourth metal layer. Therefore, in the embodiment of the present disclosure, the active layer of the oxide transistor in the shift register unit and the active layer of the oxide transistor in the pixel circuit may be arranged in the same layer, and the gate electrode of the oxide transistor in the shift register unit and the gate electrode of the oxide transistor in the pixel circuit are arranged in the same layer, so that LTPO technology can be implemented in the shift register unit without increasing the layout layer structure of the display substrate, and therefore, the display panel including the display substrate can reduce the power consumption of the gate driving circuit and improve the product performance in the low-frequency driving mode.

At least one embodiment of the present disclosure also provides a display device including the display substrate according to any embodiment of the present disclosure.

Figure 6:
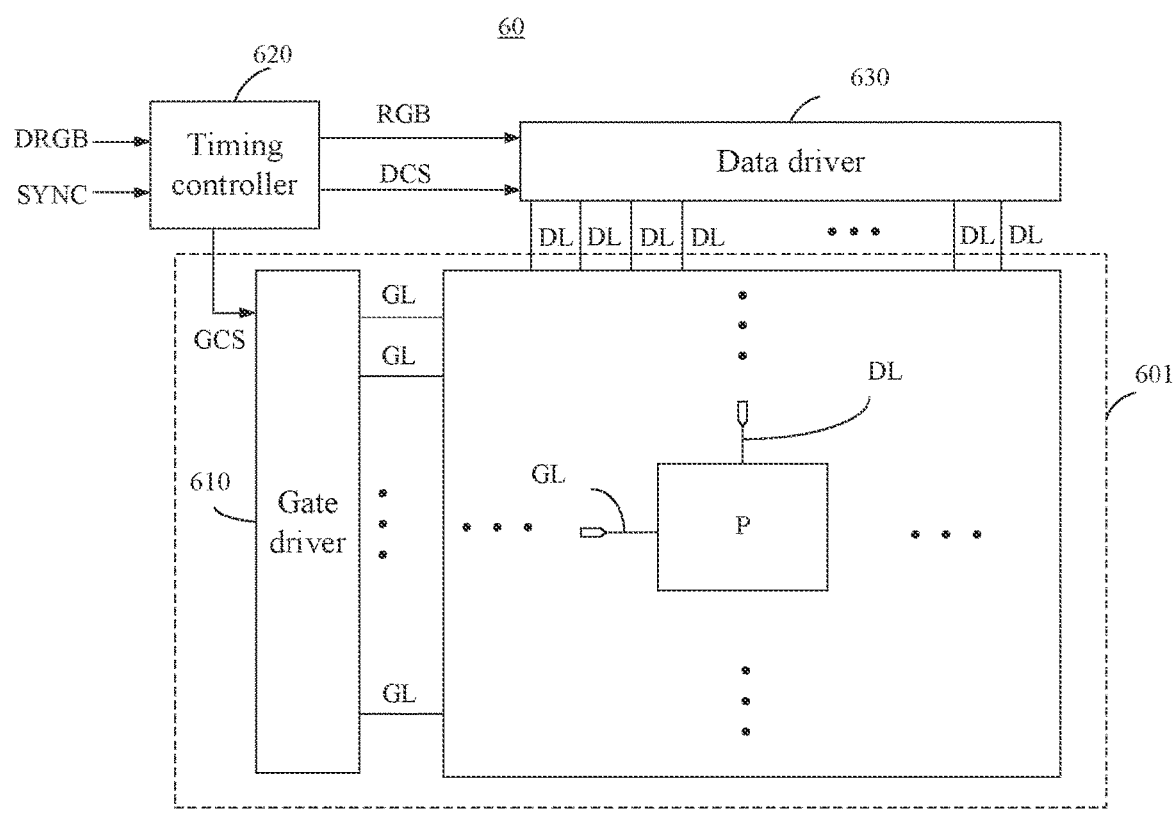
FIG. 6 is a schematic diagram of a display device provided by some embodiments of the present disclosure.

FIG. 6 is a schematic diagram of a display device provided by some embodiments of the present disclosure.

For example, as shown in FIG. 6, the display device 60 includes a display substrate 601. The display substrate 601 may be the display substrate described in any embodiment of the present disclosure, such as the display substrate 1 shown in FIG. 1.

For example, in the example shown in FIG. 6, the display substrate 601 includes a gate driver 610, for example, the gate driver 610 may be the gate driving circuit 130 shown in FIG. 1, and the gate driver 610 is disposed in the peripheral region of the display substrate 601.

For example, as shown in FIG. 6, the display device 60 further includes a timing controller 620 and a data driver 630.

For example, the display device 60 includes a plurality of pixel units P defined according to the intersection of a plurality of gate lines GL and a plurality of data lines DL, and the plurality of pixel units P are arranged in the display region of the display substrate 601; the gate driver 610 is used to drive the plurality of gate lines GL; the data driver 630 is used to drive the plurality of data lines DL.

For example, the timing controller 620 processes externally input digital image data DRGB to match the size and the resolution of the display device 60, and then provides the processed image data RGB to the data driver 630. The timing controller 620 generates the scanning control signal GCS and the data control signal DCS by using the synchronization signal SYNC (such as the dot clock DCLK, the data enable signal DE, the horizontal synchronization signal Hsync, and the vertical synchronization signal Vsync) input from the outside of the display device 60. The timing controller 620 also provides the scanning control signal GCS to the gate driver 610 and provides the data control signal DCS to the data driver 630 to control the gate driver 610 and the data driver 630.

For example, taking the gate driver 610 as the gate driving circuit 130 shown in FIG. 1 as an example, the output terminals OUT of the plurality of shift register units 100 in the gate driving circuit 130 are connected to the plurality of gate lines GL correspondingly. The plurality of gate lines GL are correspondingly connected with pixel units P arranged in a plurality of rows. The output terminals OUT of the plurality of shift register units 100 in the gate driving circuit 130 sequentially output signals to the plurality of gate lines GL, so as to achieve performing progressive scanning on the pixel units P of the plurality of rows in the display device 60. For example, the gate driver 610 may be implemented as a semiconductor chip or integrated in the display device 60 to constitute a GOA circuit.

For example, the data driver 630 uses the reference gamma voltage to convert the processed image data RGB input from the timing controller 620 into data signals according to a plurality of data control signals DCS from the timing controller 620. The data driver 630 provides converted data signals to the plurality of data lines DL. For example, the data driver 630 may be implemented as a semiconductor chip.

For example, as shown in FIG. 1, the scanning control signal GCS provided by the timing controller 620 may be transmitted to the first-stage shift register unit 100-1 in the gate driving circuit 130 through the trigger signal line NGSTV as a trigger signal.

The technical effect and the implementation principle of the display device 60 are basically the same as those of the display substrate 1 described in the embodiments of the present disclosure, and will not be repeated here.

For example, the display device 60 may also include other devices, such as a signal decoding circuit, a voltage conversion circuit, etc., and these components may adopt existing conventional components, which are not limited by the embodiments of the present disclosure.

For example, the display device 60 may be a liquid crystal panel, an electronic paper, an OLED panel, a mobile phone, a tablet computer, a television, a display, a notebook computer, a digital photo frame, a navigator, and any other product or component with display function, and the embodiments of the present disclosure are not limited to this.

At least one embodiment of that present disclosure provide a manufacturing method for manufacturing a display substrate.

Figure 7:
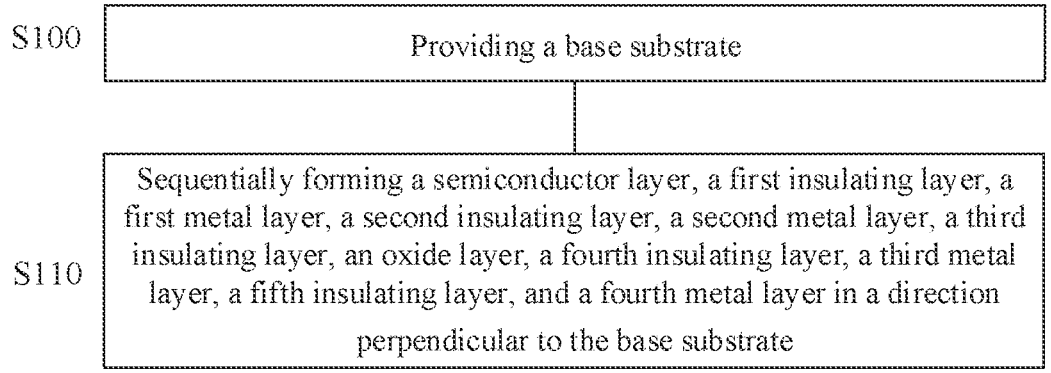
FIG. 7 is a flowchart of a manufacturing method of a display substrate provided by at least one embodiment of the present disclosure.

FIG. 7 is a flowchart of a manufacturing method of a display substrate provided by at least one embodiment of the present disclosure. For example, the manufacturing method may be used to manufacture the display substrate provided by any embodiment of the present disclosure. For example, the manufacturing method may be used to manufacture the display substrate shown in FIG. 1.

As shown in FIG. 7, the manufacturing method of the display substrate includes the following steps S100 and S110.

S100: providing a base substrate.

S110: sequentially forming a semiconductor layer, a first insulating layer, a first metal layer, a second insulating layer, a second metal layer, a third insulating layer, an oxide layer, a fourth insulating layer, a third metal layer, a fifth insulating layer, and a fourth metal layer in a direction perpendicular to the base substrate.

For step S100, for example, the base substrate 10 may be made of glass, plastic, quartz, or other suitable materials, and the embodiments of the present disclosure are not limited to this. For example, as shown in FIG. 1, the base substrate 10 includes a display region 110 and a peripheral region 120.

For example, in step S110, a plurality of clock signal lines are located in the fourth metal layer; the gate driving circuit is formed in the semiconductor layer, the oxide layer, the first metal layer, the second metal layer, the third metal layer, and the fourth metal layer; the gate driving circuit is respectively connected with the plurality of clock signal lines through a plurality of holes located in the first insulating layer, the second insulating layer, the third insulating layer, the fourth insulating layer, and the fifth insulating layer.

It should be noted that in various embodiments of the present disclosure, the flow of the manufacturing method of the display substrate may include more or less steps, which may be executed sequentially or in parallel. Although the flow of the manufacturing method described above includes a plurality of steps appearing in a specific order, it should be clearly understood that the order of the plurality of steps is not limited. The manufacturing method described above can be performed once or performed multiple times according to predetermined conditions.

For the technical effect of the manufacturing method of the display substrate provided by the embodiments of the present disclosure, reference may be made to the technical effect of the display substrate provided by the embodiments of the present disclosure, which will not be repeated here.

For the present disclosure, the following statements should be noted:

(1) The accompanying drawings of the embodiments of the present disclosure involve only the structure(s) in connection with the embodiment(s) of the present disclosure, and other structure(s) can refer to common design(s).

(2) For the purpose of clarity, in accompanying drawings for illustrating the embodiment(s) of the present disclosure, the thickness and size of a layer or a structure may be enlarged. However, it should understood that, in the case in which a component or element such as a layer, film, region, substrate, or the like is referred to be "on" or "under" another component or element, it may be directly on or under the another component or element or a component or element is interposed therebetween.

(3) In case of no conflict, the embodiments of the present disclosure and the features in one embodiment or in different embodiments can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A display substrate, comprising: a base substrate, and a gate driving circuit and a plurality of clock signal lines arranged on the base substrate,
    wherein the gate driving circuit comprises a plurality of shift register units,
    each shift register unit comprises an input circuit, a first control circuit, a second control circuit, an output circuit, a trigger terminal, and an output terminal,
    the input circuit is electrically connected with the trigger terminal and a first node respectively and receives a first control signal, and is configured to input a trigger signal received by the trigger terminal to the first node under control of the first control signal;
    the first control circuit is electrically connected with the first node, a second node, and a first output node respectively and receives the first control signal, a second control signal, and a third control signal, and is configured to write a first output control signal into the first output node under control of the first control signal, a voltage of the first node, and the second control signal, wherein the first output control signal comprises the third control signal;
    the second control circuit is electrically connected with the first node, the second node, and a second output node respectively and receives the second control signal, and is configured to write a second output control signal into the second output node under control of the second control signal and a voltage of the second node;
    the output circuit is electrically connected with a first voltage line, a second voltage line, the first output node, the second output node, and the output terminal respectively, and is configured to write a first voltage signal provided by the first voltage line or a second voltage signal provided by the second voltage line into the output terminal as an output signal under control of the first output control signal and the second output control signal;
    the plurality of clock signal lines comprise a first clock signal line, a second clock signal line, and a third clock signal line,
    the first clock signal line is configured to provide a first clock signal, the second clock signal line is configured to provide a second clock signal, and the third clock signal line is configured to provide a third clock signal,
    the plurality of shift register units comprise an n-th stage shift register unit, and n is a positive integer,
    an input circuit of the n-th stage shift register unit is connected with the first clock signal line to receive the first clock signal as the first control signal,
    a first control circuit of the n-th stage shift register unit is connected with the first clock signal line, the second clock signal line, and the third clock signal line to receive the first clock signal as the first control signal, to receive the second clock signal as the second control signal, and to receive the third clock signal as the third control signal,
    a second control circuit of the n-th stage shift register unit is connected with the second clock signal line to receive the second clock signal as the second control signal, and
    a phase of the second clock signal is opposite to a phase of the third clock signal.

2. The display substrate according to claim 1, wherein on the base substrate, the first clock signal line, the second clock signal line, and the third clock signal line extend in a first direction and are arranged in a second direction different from the first direction.

3. The display substrate according to claim 2, wherein in the second direction, the first clock signal line, the third clock signal line, and the second clock signal line are sequentially arranged;
    wherein on the base substrate, the first voltage line and the second voltage line extend in the first direction and are arranged in the second direction; and
    wherein in the second direction, the first voltage line is between the third clock signal line and the second clock signal line, and the first clock signal line and the third clock signal line are between the first voltage line and the second voltage line.

4. The display substrate according to claim 2, wherein each shift register unit comprises at least one first transistor, and at least one first transistor in the n-th stage shift register unit is electrically connected with the second clock signal line to be turned on or off under control of the second clock signal;
    wherein the at least one first transistor is an oxide transistor.

5. The display substrate according to claim 4, wherein each shift register unit further comprises a plurality of second transistors, a type of at least one active layer of the at least one first transistor is different from types of active layers of the plurality of second transistors,
    the at least one active layer of the at least one first transistor is located in a same layer, and the active layers of the plurality of second transistors are located in a same layer, a layer where the at least one active layer of the at least one first transistor is located is different from a layer where the active layers of the plurality of second transistors are located;
wherein the plurality of second transistors are polysilicon transistors;
wherein an orthographic projection of the at least one active layer of the at least one first transistor on the base substrate does not overlap with an orthographic projection of the active layers of the plurality of second transistors on the base substrate;
wherein at least one gate electrode of the at least one first transistor is located in a same layer, and gate electrodes of the plurality of second transistors are located in a same layer,
a layer where the at least one gate electrode of the at least one first transistor is located is different from a layer where the gate electrodes of the plurality of second transistors are located.

6. The display substrate according to claim 4, further comprising at least one gate connection line corresponding to the at least one first transistor one by one and a plurality of holes,
wherein the plurality of holes comprise at least one first hole corresponding to each gate connection line,
for each first transistor: a gate electrode of the first transistor in the n-th stage shift register unit is electrically connected with a gate connection line corresponding to the first transistor, and the gate connection line corresponding to the first transistor extends to the second clock signal line approximately along the second direction and is electrically connected with the second clock signal line through at least one first hole corresponding to the gate connection line;
wherein the gate electrode of the first transistor is integrally provided with the gate connection line corresponding to the first transistor;
wherein an orthographic projection of each gate connection line on the base substrate does not overlap with an orthographic projection of holes other than the first hole in the plurality of holes on the base substrate.

7. The display substrate according to claim 5, further comprising a semiconductor layer, a first insulating layer, a first metal layer, a second insulating layer, a second metal layer, a third insulating layer, an oxide layer, a fourth insulating layer, a third metal layer, a fifth insulating layer, and a fourth metal layer, which are successively stacked on the base substrate;
wherein the semiconductor layer is on the base substrate, the first insulating layer is on a side of the semiconductor layer away from the base substrate, the first metal layer is on a side of the first insulating layer away from the semiconductor layer, the second insulating layer is on a side of the first metal layer away from the first insulating layer, the second metal layer is on a side of the second insulating layer away from the first metal layer, the third insulating layer is on a side of the second metal layer away from the second insulating layer, the oxide layer is on a side of the third insulating layer away from the second metal layer, the fourth insulating layer is on a side of the oxide layer away from the third insulating layer, the third metal layer is on a side of the fourth insulating layer away from the oxide layer, the fifth insulating layer is on a side of the third metal layer away from the fourth insulating layer, and the fourth metal layer is on a side of the fifth insulating layer away from the third metal layer, and the at least one active layer of the at least one first transistor is in the oxide layer, and the active layers of the plurality of second transistors are in the semiconductor layer;
wherein at least one gate electrode of the at least one first transistor is in the third metal layer, and gate electrodes of the plurality of second transistors are in the first metal layer;
wherein the plurality of clock signal lines are in the fourth metal layer.

8. The display substrate according to claim 1, wherein n is an odd number or an even number, and the plurality of shift register units further comprise a (n+1)-th stage shift register unit,
the plurality of clock signal lines further comprise a fourth clock signal line, and the fourth clock signal line is configured to provide a fourth clock signal,
an input circuit of the (n+1)-th stage shift register unit is connected with the third clock signal line to receive the third clock signal as the first control signal,
a first control circuit of the (n+1)-th stage shift register unit is connected with the first clock signal line, the third clock signal line, and the fourth clock signal line, to receive the third clock signal as the first control signal, the fourth clock signal as the second control signal, and the first clock signal as the third control signal,
a second control circuit of the (n+1)-th stage shift register unit is connected with the fourth clock signal line to receive the fourth clock signal as the second control signal, and
a phase of the first clock signal is opposite to a phase of the fourth clock signal;
wherein on the base substrate, the first clock signal line, the second clock signal line, the third clock signal line, and the fourth clock signal line extend in a first direction and are arranged in a second direction different from the first direction;
wherein in the second direction, the first clock signal line, the third clock signal line, the fourth clock signal line, and the second clock signal line are arranged in sequence.

9. The display substrate according to claim 8, wherein each shift register unit comprises at least one first transistor, and the at least one first transistor is an oxide transistor,
at least one first transistor in the (n+1)-th stage shift register unit is electrically connected with the fourth clock signal line to be turned on or off under control of the fourth clock signal;
wherein the display substrate further comprises at least one gate connection line corresponding to the at least one first transistor one by one and a plurality of holes,
wherein the plurality of holes comprise at least one second hole corresponding to each gate connection line,
wherein for each first transistor in the (n+1)-th stage shift register unit: a gate electrode of the first transistor is electrically connected with a gate connection line corresponding to the first transistor, and the gate connection line corresponding to the first transistor extends to the fourth clock signal line approximately along the second direction and is electrically connected with the fourth clock signal line through at least one second hole corresponding to the gate connection line.

10. The display substrate according to claim 1, further comprising a trigger signal line disposed on the base substrate, wherein a trigger terminal of a first-stage shift register unit among the plurality of shift register units is electrically connected with the trigger signal line to receive a signal provided by the trigger signal line as a trigger signal of the first-stage shift register unit, in addition to the first-stage shift register unit, a trigger terminal of a current-stage shift register unit among the plurality of shift register units is connected to an output terminal of a previous-stage shift register unit adjacent to the current-stage shift register unit to receive an output signal output by the output terminal of the previous-stage shift register unit as a trigger signal of the current-stage shift register unit.

11. The display substrate according to claim 4, wherein the first control circuit is further electrically connected with the first voltage line, the second voltage line, and the input circuit, the first control circuit comprises a first control input sub-circuit, a second control input sub-circuit, a bootstrap sub-circuit, a first control output sub-circuit, and a second control output sub-circuit, the first control input sub-circuit is electrically connected to the second voltage line and the second node, respectively, and is configured to write the second voltage signal into the second node under control of the first control signal;

the second control input sub-circuit is electrically connected with the input circuit and the second node, respectively, and is configured to write the first control signal into the second node under control of the trigger signal;

the bootstrap sub-circuit is electrically connected with the second node and a third node, respectively, and is configured to write the third control signal into the third node under control of the voltage of the second node;

the first control output sub-circuit is electrically connected with the third node and the first output node, respectively, and is configured to write the third control signal into the first output node under the control of the second control signal;

the second control output sub-circuit is electrically connected with the first node, the first voltage line, and the first output node, respectively, and is configured to write the first voltage signal into the first output node under control of the voltage of the first node, and wherein the first output control signal further comprises the first voltage signal.

12. The display substrate according to claim 11, wherein the first control input sub-circuit comprises a first control input transistor, a first electrode of the first control input transistor is electrically connected to the second voltage line, a second electrode of the first control input transistor is electrically connected to the second node, and a gate electrode of the first control input transistor is configured to receive the first control signal;

the second control input sub-circuit comprises a second control input transistor, a first electrode of the second control input transistor is configured to receive the first control signal, a second electrode of the second control input transistor is electrically connected with the second node, and a gate electrode of the second control input transistor is electrically connected with the first node;

the bootstrap sub-circuit comprises a first capacitor and a bootstrap transistor, a gate electrode of the bootstrap transistor is electrically connected to the second node, a second electrode of the bootstrap transistor is electrically connected to the third node, and a first electrode of the bootstrap transistor is configured to receive the third control signal;

a first end of the first capacitor is connected to the second node, and a second end of the first capacitor is electrically connected to the third node;

the first control output sub-circuit comprises a first control output transistor, a gate electrode of the first control output transistor is configured to receive the second control signal, a first electrode of the first control output transistor is electrically connected with the third node, and a second electrode of the first control output transistor is electrically connected with the first output node; and the second control output sub-circuit comprises a second control output transistor, a gate electrode of the second control output transistor is electrically connected to the first node, a first electrode of the second control output transistor is electrically connected to the first voltage line, and a second electrode of the second control output transistor is electrically connected to the first output node;

wherein the at least one first transistor comprises the first control output transistor;

wherein on the base substrate, an orthographic projection of the gate electrode of the second control output transistor in the first direction at least partially overlaps with an orthographic projection of the gate electrode of the first control output transistor in the first direction.

13. The display substrate according to claim 11, wherein the first control circuit further comprises a first isolation sub-circuit, the first isolation sub-circuit is electrically connected with the second node, the bootstrap sub-circuit, and the second voltage line, respectively, and is configured to isolate the second node from the bootstrap sub-circuit;

wherein the first isolation sub-circuit comprises a first isolation transistor, a first electrode of the first isolation transistor is electrically connected with the second node, a second electrode of the first isolation transistor is electrically connected with the bootstrap sub-circuit, and a gate electrode of the first isolation transistor is electrically connected with the second voltage line.

14. The display substrate according to claim 4, wherein the second control circuit is also electrically connected to the first voltage line, the second control circuit comprises a third control input sub-circuit, the third control input sub-circuit is electrically connected with the first node, the second node, and the first voltage line, respectively, and is configured to write the first voltage signal into the first node under control of the voltage of the second node and the second control signal;

wherein the third control input sub-circuit comprises a third control input transistor and a fourth control input transistor, a first electrode of the third control input transistor is electrically connected to the first voltage line, a second electrode of the third control input transistor is electrically connected to a first electrode of the fourth control input transistor, and a gate electrode of the third control input transistor is electrically connected to the second node, a second electrode of the fourth control input transistor is electrically connected with the first node, and a gate electrode of the fourth control input transistor is configured to receive the second control signal;

wherein the at least one first transistor comprises the fourth control input transistor.

15. The display substrate according to claim 14, wherein the second control circuit is also electrically connected to the second voltage line, the second control circuit further comprises a second isolation sub-circuit, the second isolation sub-circuit is electrically connected with the first node, the second output node, and the second voltage line, respectively, and is configured to isolate the first node and the second output node;

wherein the second isolation sub-circuit comprises a second isolation transistor, a first electrode of the second isolation transistor is electrically connected to the first node, a second electrode of the second isolation transistor is electrically connected to the second output node, and a gate electrode of the second isolation transistor is electrically connected to the second voltage line.

16. The display substrate according to claim 1, wherein the output circuit comprises a first output sub-circuit and a second output sub-circuit, the first output sub-circuit is electrically connected with the first output node, the first voltage line, and the output terminal, respectively, and is configured to store the first output control signal and write the first voltage signal into the output terminal in a first phase under control of the first output control signal;

the second output sub-circuit is electrically connected with the second output node, the second voltage line, and the output terminal, respectively, and is configured to store the second output control signal and write the second voltage signal into the output terminal in a second phase under control of the second output control signal;

the output signal comprises the first voltage signal in the first phase and the second voltage signal in the second phase;

wherein the output circuit is further configured to receive the third control signal, the first output sub-circuit comprises a first output transistor and a second capacitor, a gate electrode of the first output transistor is electrically connected with the first output node, a first electrode of the first output transistor is electrically connected with the first voltage line, a second electrode of the first output transistor is electrically connected with the output terminal, a first end of the second capacitor is electrically connected with the first output node, and a second end of the second capacitor is electrically connected with the first voltage line; and the second output sub-circuit comprises a second output transistor and a third capacitor, a gate electrode of the second output transistor is electrically connected with the second output node, a first electrode of the second output transistor is electrically connected with the second voltage line, a second electrode of the second output transistor is electrically connected with the output terminal, a first end of the third capacitor is electrically connected with the first output node, and a second end of the third capacitor is configured to receive the third control signal.

17. The display substrate according to claim 4, further comprising a plurality of pixel circuits disposed on the base substrate, wherein the gate driving circuit is configured to output a plurality of output signals to the plurality of pixel circuits to control the plurality of pixel circuits, each pixel circuit comprises at least one third transistor, a type of at least one active layer of the at least one first transistor is same as a type of at least one active layer of the at least one third transistor, the at least one active layer of the at least one first transistor and the at least one active layer of the at least one third transistor are in a same layer, at least one gate electrode of the at least one first transistor and at least one gate electrode of the at least one third transistor are in a same layer;

wherein the at least one third transistor is an oxide transistor.

18. The display substrate according to claim 17, wherein each pixel circuit comprises a driving sub-circuit, a data writing sub-circuit, a storage sub-circuit, a compensation sub-circuit, a light emitting control sub-circuit, a first reset sub-circuit, a second reset sub-circuit, and a refresh control sub-circuit, the driving sub-circuit comprises a control terminal, a first terminal, and a second terminal;

the data writing sub-circuit is configured to write a data signal provided by the data signal line to the first terminal of the driving sub-circuit in response to a scanning signal;

the storage sub-circuit is connected to the control terminal of the driving sub-circuit and configured to store a compensation signal obtained based on the data signal;

the compensation sub-circuit is connected to the second terminal of the driving sub-circuit and configured to perform threshold compensation on the driving sub-circuit in response to a compensation control signal;

the light emitting control sub-circuit is connected to the first terminal and the second terminal of the driving sub-circuit and configured to control a driving current generated by the driving sub-circuit to be transmitted to a light emitting element in response to a light emitting control signal;

the first reset sub-circuit is connected to the refresh control sub-circuit and configured to reset the control terminal of the driving sub-circuit through the refresh control sub-circuit in response to a first reset signal;

the second reset sub-circuit is configured to reset the light emitting element in response to a second reset signal; and the refresh control sub-circuit is connected to the control terminal of the driving sub-circuit and the compensation sub-circuit, and is configured to achieve a connection or disconnection between the control terminal of the driving sub-circuit and the compensation sub-circuit in response to a refresh control signal;

wherein the refresh control sub-circuit comprises a refresh control transistor, and the at least one third transistor comprises the refresh control transistor;

wherein the plurality of output signals output by the gate driving circuit comprise the refresh control signal.

19. A display device comprising a display substrate, wherein the display substrate comprises: a base substrate, and a gate driving circuit and a plurality of clock signal lines arranged on the base substrate, wherein the gate driving circuit comprises a plurality of shift register units, each shift register unit comprises an input circuit, a first control circuit, a second control circuit, an output circuit, a trigger terminal, and an output terminal, the input circuit is electrically connected with the trigger terminal and a first node respectively and receives a first control signal, and is configured to input a trigger signal received by the trigger terminal to the first node under control of the first control signal;

the first control circuit is electrically connected with the first node, a second node, and a first output node respectively and receives the first control signal, a second control signal, and a third control signal, and is configured to write a first output control signal into the first output node under control of the first control signal, a voltage of the first node, and the second control signal, wherein the first output control signal comprises the third control signal;

the second control circuit is electrically connected with the first node, the second node, and a second output node respectively and receives the second control signal, and is configured to write a second output control signal into the second output node under control of the second control signal and a voltage of the second node;

the output circuit is electrically connected with a first voltage line, a second voltage line, the first output node, the second output node, and the output terminal respectively, and is configured to write a first voltage signal provided by the first voltage line or a second voltage signal provided by the second voltage line into the output terminal as an output signal under control of the first output control signal and the second output control signal;

the plurality of clock signal lines comprise a first clock signal line, a second clock signal line, and a third clock signal line, the first clock signal line is configured to provide a first clock signal, the second clock signal line is configured to provide a second clock signal, and the third clock signal line is configured to provide a third clock signal, the plurality of shift register units comprise an n-th stage shift register unit, and n is a positive integer, an input circuit of the n-th stage shift register unit is connected with the first clock signal line to receive the first clock signal as the first control signal, a first control circuit of the n-th stage shift register unit is connected with the first clock signal line, the second clock signal line, and the third clock signal line to receive the first clock signal as the first control signal, to receive the second clock signal as the second control signal, and to receive the third clock signal as the third control signal, a second control circuit of the n-th stage shift register unit is connected with the second clock signal line to receive the second clock signal as the second control signal, and a phase of the second clock signal is opposite to a phase of the third clock signal.

20. A manufacturing method for manufacturing a display substrate, wherein the display substrate comprises: a base substrate, and a gate driving circuit and a plurality of clock signal lines arranged on the base substrate, wherein the gate driving circuit comprises a plurality of shift register units, each shift register unit comprises an input circuit, a first control circuit, a second control circuit, an output circuit, a trigger terminal, and an output terminal, the input circuit is electrically connected with the trigger terminal and a first node respectively and receives a first control signal, and is configured to input a trigger signal received by the trigger terminal to the first node under control of the first control signal;

the first control circuit is electrically connected with the first node, a second node, and a first output node respectively and receives the first control signal, a second control signal, and a third control signal, and is configured to write a first output control signal into the first output node under control of the first control signal, a voltage of the first node, and the second control signal, wherein the first output control signal comprises the third control signal;

the second control circuit is electrically connected with the first node, the second node, and a second output node respectively and receives the second control signal, and is configured to write a second output control signal into the second output node under control of the second control signal and a voltage of the second node;

the output circuit is electrically connected with a first voltage line, a second voltage line, the first output node, the second output node, and the output terminal respectively, and is configured to write a first voltage signal provided by the first voltage line or a second voltage signal provided by the second voltage line into the output terminal as an output signal under control of the first output control signal and the second output control signal;

the plurality of clock signal lines comprise a first clock signal line, a second clock signal line, and a third clock signal line, the first clock signal line is configured to provide a first clock signal, the second clock signal line is configured to provide a second clock signal, and the third clock signal line is configured to provide a third clock signal, the plurality of shift register units comprise an n-th stage shift register unit, and n is a positive integer, an input circuit of the n-th stage shift register unit is connected with the first clock signal line to receive the first clock signal as the first control signal, a first control circuit of the n-th stage shift register unit is connected with the first clock signal line, the second clock signal line, and the third clock signal line to receive the first clock signal as the first control signal, to receive the second clock signal as the second control signal, and to receive the third clock signal as the third control signal, a second control circuit of the n-th stage shift register unit is connected with the second clock signal line to receive the second clock signal as the second control signal, and a phase of the second clock signal is opposite to a phase of the third clock signal;

wherein the manufacturing method comprises:

providing the base substrate;

sequentially forming a semiconductor layer, a first insulating layer, a first metal layer, a second insulating layer, a second metal layer, a third insulating layer, an oxide layer, a fourth insulating layer, a third metal layer, a fifth insulating layer, and a fourth metal layer in a direction perpendicular to the base substrate;

wherein the plurality of clock signal lines are in the fourth metal layer;

the gate driving circuit is formed in the semiconductor layer, the oxide layer, the first metal layer, the second metal layer, the third metal layer, and the fourth metal layer; and the gate driving circuit is respectively connected with the plurality of clock signal lines through a plurality of holes located in the first insulating layer, the second insulating layer, the third insulating layer, the fourth insulating layer, and the fifth insulating layer.

\* \* \* \* \*